United States Patent
Eitan et al.

(10) Patent No.: US 7,692,961 B2
(45) Date of Patent: Apr. 6, 2010

(54) METHOD, CIRCUIT AND DEVICE FOR DISTURB-CONTROL OF PROGRAMMING NONVOLATILE MEMORY CELLS BY HOT-HOLE INJECTION (HHI) AND BY CHANNEL HOT-ELECTRON (CHE) INJECTION

(75) Inventors: Boaz Eitan, Ra'anana (IL); Natalie Shainsky, Or-Akiva (IL)

(73) Assignee: Saifun Semiconductors Ltd., Netanya (IL)

( * ) Notice: Subject to any disclaimer, the term of this patent is extended or adjusted under 35 U.S.C. 154(b) by 283 days.

(21) Appl. No.: 11/462,011

(22) Filed: Aug. 2, 2006

(65) Prior Publication Data

US 2007/0196982 A1    Aug. 23, 2007

Related U.S. Application Data

(60) Provisional application No. 60/774,609, filed on Feb. 21, 2006.

(51) Int. Cl.
*G11C 16/34* (2006.01)

(52) U.S. Cl. .............. 365/185.02; 365/185.22; 365/185.24; 365/185.28; 365/185.18; 365/185.16; 365/185.03

(58) Field of Classification Search ............ 365/185.03, 365/185.02, 185.16, 185.22, 185.24, 185.18, 365/185.28
See application file for complete search history.

(56) References Cited

U.S. PATENT DOCUMENTS 3,881,180 A    4/1975    Gosney, Jr.
3,895,360 A    7/1975    Cricchi et al.
3,952,325 A    4/1976    Beale et al.
4,016,588 A    4/1977    Ohya et al.
4,017,888 A    4/1977    Christie et al.
4,145,703 A    3/1979    Blanchard et al.
4,151,021 A    4/1979    McElroy
4,173,766 A    11/1979   Hayes
4,173,791 A    11/1979   Bell
4,247,861 A    1/1981    Hsu et al.
4,257,832 A    3/1981    Schwabe et al.
4,281,397 A    7/1981    Neal et al.
4,306,353 A    12/1981   Jacobs et al.
4,342,102 A    7/1982    Puar
4,342,149 A    8/1982    Jacobs et al.
4,360,900 A    11/1982   Bate (Continued)

FOREIGN PATENT DOCUMENTS

EP    0 656 628    6/1995
EP    0751560      6/1995

(Continued)

OTHER PUBLICATIONS

Bude et al., EEPROM/Flash Sub 3.0V drain—Source Bias Hot Carrier Writing, IEDM, 1995, pp. 989-992.

(Continued)

*Primary Examiner*—Andrew Q Tran
(74) *Attorney, Agent, or Firm*—Eitan Mehulai, Law Group

(57) ABSTRACT

Programming a NVM memory cell such as an NROM cell by using hot hole injection (HHI), followed by channel hot electron (CHE) injection. CHE injection increases the threshold voltage (Vt) of bits of memory cells that were disturbed (unnecessarily programmed) in HHI programming step. Page Write may be performed using a combination of only HHI, followed by CHE without any Erase.

6 Claims, 7 Drawing Sheets

U.S. PATENT DOCUMENTS

| | | |
|---|---|---|
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari et al. |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,604,804 A | 2/1997 | Micali |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,650,959 A | 7/1997 | Hayashi et al. |
| 5,654,568 A | 8/1997 | Nakao |

| | | | | | |
|---|---|---|---|---|---|
| 5,656,513 A | 8/1997 | Wang et al. | 5,930,195 A | 7/1999 | Komatsu et al. |
| 5,657,332 A | 8/1997 | Auclair et al. | 5,933,366 A | 8/1999 | Yoshikawa |
| 5,661,060 A | 8/1997 | Gill et al. | 5,933,367 A | 8/1999 | Matsuo et al. |
| 5,663,907 A | 9/1997 | Frayer et al. | 5,936,888 A | 8/1999 | Sugawara |
| 5,666,365 A | 9/1997 | Kostreski | 5,940,332 A | 8/1999 | Artieri |
| 5,672,959 A | 9/1997 | Der | 5,946,258 A | 8/1999 | Evertt et al. |
| 5,675,280 A | 10/1997 | Nomura et al. | 5,946,558 A | 8/1999 | Hsu |
| 5,677,867 A | 10/1997 | Hazani | 5,949,714 A | 9/1999 | Hemink et al. |
| 5,677,869 A | 10/1997 | Fazio et al. | 5,949,728 A | 9/1999 | Liu et al. |
| 5,683,925 A | 11/1997 | Irani et al. | 5,959,311 A | 9/1999 | Shih et al. |
| 5,689,459 A | 11/1997 | Chang et al. | 5,963,412 A | 10/1999 | En |
| 5,694,356 A | 12/1997 | Wong et al. | 5,963,465 A | 10/1999 | Eitan |
| 5,696,929 A | 12/1997 | Hasbun et al. | 5,966,603 A | 10/1999 | Eitan |
| 5,708,608 A | 1/1998 | Park et al. | 5,969,989 A | 10/1999 | Iwahashi |
| 5,712,814 A | 1/1998 | Fratin et al. | 5,969,993 A | 10/1999 | Takeshima |
| 5,712,815 A | 1/1998 | Bill et al. | 5,973,373 A | 10/1999 | Krautschneider et al. |
| 5,715,193 A | 2/1998 | Norman | 5,982,666 A | 11/1999 | Campardo |
| 5,717,581 A | 2/1998 | Canclini | 5,986,940 A | 11/1999 | Atsumi et al. |
| 5,717,632 A | 2/1998 | Richart et al. | 5,990,526 A | 11/1999 | Bez et al. |
| 5,717,635 A | 2/1998 | Akatsu | 5,991,202 A | 11/1999 | Derhacobian et al. |
| 5,721,781 A | 2/1998 | Deo et al. | 5,999,444 A | 12/1999 | Fujiwara et al. |
| 5,726,946 A | 3/1998 | Yamagata et al. | 5,999,494 A | 12/1999 | Holzrichter |
| 5,748,534 A | 5/1998 | Dunlap et al. | 6,000,006 A | 12/1999 | Bruce et al. |
| 5,751,037 A | 5/1998 | Aozasa et al. | 6,005,423 A | 12/1999 | Schultz |
| 5,751,637 A | 5/1998 | Chen et al. | 6,011,725 A | 1/2000 | Eitan |
| 5,754,475 A | 5/1998 | Bill et al. | 6,018,186 A | 1/2000 | Hsu |
| 5,760,445 A | 6/1998 | Diaz | 6,020,241 A | 2/2000 | You et al. |
| 5,760,634 A | 6/1998 | Fu | 6,028,324 A | 2/2000 | Su et al. |
| 5,768,192 A | 6/1998 | Eitan | 6,030,871 A | 2/2000 | Eitan |
| 5,768,193 A | 6/1998 | Lee et al. | 6,034,403 A | 3/2000 | Wu |
| 5,771,197 A | 6/1998 | Kim | 6,034,896 A | 3/2000 | Ranaweera et al. |
| 5,774,395 A | 6/1998 | Richart et al. | 6,037,627 A | 3/2000 | Kitamura et al. |
| 5,777,919 A | 7/1998 | Chi-Yung et al. | 6,040,610 A | 3/2000 | Noguchi et al. |
| 5,781,476 A | 7/1998 | Seki et al. | 6,044,019 A | 3/2000 | Cernea et al. |
| 5,781,478 A | 7/1998 | Takeuchi et al. | 6,044,022 A | 3/2000 | Nachumovsky |
| 5,783,934 A | 7/1998 | Tran | 6,063,666 A | 5/2000 | Chang et al. |
| 5,784,314 A | 7/1998 | Sali et al. | 6,064,226 A | 5/2000 | Earl |
| 5,787,036 A | 7/1998 | Okazawa | 6,064,251 A | 5/2000 | Park |
| 5,793,079 A | 8/1998 | Georgescu et al. | 6,064,591 A | 5/2000 | Takeuchi et al. |
| 5,801,076 A | 9/1998 | Ghneim et al. | 6,074,916 A | 6/2000 | Cappelletti |
| 5,805,500 A | 9/1998 | Campardo et al. | 6,075,402 A | 6/2000 | Ghilardelli |
| 5,808,506 A | 9/1998 | Tran | 6,075,724 A | 6/2000 | Li et al. |
| 5,812,449 A | 9/1998 | Song | 6,078,518 A | 6/2000 | Chevallier |
| 5,812,456 A | 9/1998 | Hull et al. | 6,081,456 A | 6/2000 | Dadashev |
| 5,812,457 A | 9/1998 | Arase | 6,084,794 A | 7/2000 | Lu et al. |
| 5,815,435 A | 9/1998 | Van Tran | 6,091,640 A | 7/2000 | Kawahara et al. |
| 5,822,256 A | 10/1998 | Bauer et al. | 6,094,095 A | 7/2000 | Murray et al. |
| 5,825,683 A | 10/1998 | Chang et al. | 6,097,639 A | 8/2000 | Choi et al. |
| 5,825,686 A | 10/1998 | Schmitt-Landsiedel et al. | 6,107,862 A | 8/2000 | Mukainakano et al. |
| 5,828,601 A | 10/1998 | Hollmer et al. | 6,108,240 A | 8/2000 | Lavi et al. |
| 5,834,851 A | 11/1998 | Ikeda et al. | 6,108,241 A | 8/2000 | Chevallier |
| 5,835,935 A | 11/1998 | Estakhri et al. | 6,117,714 A | 9/2000 | Beatty |
| 5,836,772 A | 11/1998 | Chang et al. | 6,118,207 A | 9/2000 | Ormerod et al. |
| 5,841,700 A | 11/1998 | Chang | 6,118,692 A | 9/2000 | Banks |
| 5,847,441 A | 12/1998 | Cutter et al. | 6,122,198 A | 9/2000 | Haddad et al. |
| 5,861,771 A | 1/1999 | Matsuda et al. | 6,128,226 A | 10/2000 | Eitan et al. |
| 5,862,076 A | 1/1999 | Eitan | 6,128,227 A | 10/2000 | Kim |
| 5,864,164 A | 1/1999 | Wen | 6,130,452 A | 10/2000 | Lu et al. |
| 5,867,429 A | 2/1999 | Chen et al. | 6,130,572 A | 10/2000 | Ghilardelli et al. |
| 5,870,334 A | 2/1999 | Hemink et al. | 6,130,574 A | 10/2000 | Bloch et al. |
| 5,870,335 A | 2/1999 | Khan et al. | 6,133,095 A | 10/2000 | Eitan et al. |
| 5,872,848 A | 2/1999 | Romney et al. | 6,134,156 A | 10/2000 | Eitan |
| 5,875,128 A | 2/1999 | Ishizuka et al. | 6,137,718 A | 10/2000 | Reisinger |
| 5,877,537 A | 3/1999 | Aoki | 6,147,904 A | 11/2000 | Liron |
| 5,880,620 A | 3/1999 | Gitlin et al. | 6,147,906 A | 11/2000 | Bill et al. |
| 5,886,927 A | 3/1999 | Takeuchi | 6,150,800 A | 11/2000 | Kinoshita et al. |
| RE36,179 E | 4/1999 | Shimoda | 6,154,081 A | 11/2000 | Pakkala et al. |
| 5,892,710 A | 4/1999 | Fazio et al. | 6,156,149 A | 12/2000 | Cheung et al. |
| 5,903,031 A | 5/1999 | Yamada et al. | 6,157,242 A | 12/2000 | Fukui |
| 5,910,924 A | 6/1999 | Tanaka et al. | 6,157,570 A | 12/2000 | Nachumovsky |
| 5,920,503 A | 7/1999 | Lee et al. | 6,163,048 A | 12/2000 | Hirose et al. |
| 5,920,507 A | 7/1999 | Takeuchi et al. | 6,163,484 A | 12/2000 | Uekubo |
| 5,926,409 A | 7/1999 | Engh et al. | 6,169,691 B1 | 1/2001 | Pasotti et al. |

| Patent | Kind | Date | Inventor |
|---|---|---|---|
| 6,175,519 | B1 | 1/2001 | Lu et al. |
| 6,175,523 | B1 | 1/2001 | Yang et al. |
| 6,181,597 | B1 | 1/2001 | Nachumovsky |
| 6,181,605 | B1 | 1/2001 | Hollmer et al. |
| 6,185,143 | B1 | 2/2001 | Perner et al. |
| 6,188,211 | B1 | 2/2001 | Rincon-Mora et al. |
| 6,190,966 | B1 | 2/2001 | Ngo et al. |
| 6,192,445 | B1 | 2/2001 | Rezvani |
| 6,195,196 | B1 | 2/2001 | Kimura et al. |
| 6,198,342 | B1 | 3/2001 | Kawai |
| 6,201,282 | B1 | 3/2001 | Eitan |
| 6,201,737 | B1 | 3/2001 | Hollmer et al. |
| 6,205,055 | B1 | 3/2001 | Parker |
| 6,205,056 | B1 | 3/2001 | Pan et al. |
| 6,205,059 | B1 | 3/2001 | Gutala et al. |
| 6,208,200 | B1 | 3/2001 | Arakawa |
| 6,208,557 | B1 | 3/2001 | Bergemont et al. |
| 6,214,666 | B1 | 4/2001 | Mehta |
| 6,215,148 | B1 | 4/2001 | Eitan |
| 6,215,697 | B1 | 4/2001 | Lu et al. |
| 6,215,702 | B1 | 4/2001 | Derhacobian et al. |
| 6,218,695 | B1 | 4/2001 | Nachumovsky |
| 6,219,277 | B1 | 4/2001 | Devin et al. |
| 6,219,290 | B1 | 4/2001 | Chang et al. |
| 6,222,762 | B1 | 4/2001 | Guterman et al. |
| 6,222,768 | B1 | 4/2001 | Hollmer et al. |
| 6,233,180 | B1 | 5/2001 | Eitan et al. |
| 6,240,032 | B1 | 5/2001 | Fukumoto |
| 6,240,040 | B1 | 5/2001 | Akaogi et al. |
| 6,246,555 | B1 | 6/2001 | Tham |
| 6,252,442 | B1 | 6/2001 | Malherbe |
| 6,252,799 | B1 | 6/2001 | Liu et al. |
| 6,256,231 | B1 | 7/2001 | Lavi et al. |
| 6,261,904 | B1 | 7/2001 | Pham et al. |
| 6,265,268 | B1 | 7/2001 | Halliyal et al. |
| 6,266,281 | B1 | 7/2001 | Derhacobian et al. |
| 6,272,047 | B1 | 8/2001 | Mihnea et al. |
| 6,275,414 | B1 | 8/2001 | Randolph et al. |
| 6,281,545 | B1 | 8/2001 | Liang et al. |
| 6,282,133 | B1 | 8/2001 | Nakagawa et al. |
| 6,282,145 | B1 | 8/2001 | Tran et al. |
| 6,285,246 | B1 | 9/2001 | Basu |
| 6,285,574 | B1 | 9/2001 | Eitan |
| 6,285,589 | B1 | 9/2001 | Kajitani |
| 6,285,614 | B1 | 9/2001 | Mulatti et al. |
| 6,292,394 | B1 | 9/2001 | Cohen et al. |
| 6,297,096 | B1 | 10/2001 | Boaz |
| 6,297,143 | B1 | 10/2001 | Foote et al. |
| 6,297,974 | B1 | 10/2001 | Ganesan et al. |
| 6,304,485 | B1 | 10/2001 | Harari et al. |
| 6,307,784 | B1 | 10/2001 | Hamilton et al. |
| 6,307,807 | B1 | 10/2001 | Sakui et al. |
| 6,320,786 | B1 | 11/2001 | Chang et al. |
| 6,324,094 | B1 | 11/2001 | Chevallier |
| 6,326,265 | B1 | 12/2001 | Liu et al. |
| 6,330,192 | B1 | 12/2001 | Ohba et al. |
| 6,331,950 | B1 | 12/2001 | Kuo et al. |
| 6,335,874 | B1 | 1/2002 | Eitan |
| 6,335,990 | B1 | 1/2002 | Chen et al. |
| 6,337,502 | B1 | 1/2002 | Eitan et al. |
| 6,339,556 | B1 | 1/2002 | Watanabe |
| 6,343,033 | B1 | 1/2002 | Parker |
| 6,344,959 | B1 | 2/2002 | Milazzo |
| 6,346,442 | B1 | 2/2002 | Aloni et al. |
| 6,348,381 | B1 | 2/2002 | Jong |
| 6,348,711 | B1 | 2/2002 | Eitan |
| 6,351,415 | B1 | 2/2002 | Kushnarenko |
| 6,353,356 | B1 | 3/2002 | Liu |
| 6,353,554 | B1 | 3/2002 | Banks |
| 6,353,555 | B1 | 3/2002 | Jeong |
| 6,356,062 | B1 | 3/2002 | Elmhurst et al. |
| 6,356,469 | B1 | 3/2002 | Roohparvar et al. |
| 6,359,501 | B2 | 3/2002 | Lin et al. |
| 6,374,337 | B1 | 4/2002 | Estakhri |
| 6,385,086 | B1 | 5/2002 | Mihara et al. |
| 6,396,741 | B1 | 5/2002 | Bloom et al. |
| 6,400,209 | B1 | 6/2002 | Matsuyama et al. |
| 6,400,607 | B1 | 6/2002 | Pasotti et al. |
| 6,407,537 | B2 | 6/2002 | Antheunis |
| 6,410,388 | B1 | 6/2002 | Kluth et al. |
| 6,417,081 | B1 | 7/2002 | Thurgate |
| 6,418,506 | B1 | 7/2002 | Pashley et al. |
| 6,426,898 | B1 | 7/2002 | Mihnea et al. |
| 6,429,063 | B1 | 8/2002 | Eitan |
| 6,433,624 | B1 | 8/2002 | Grossnikle et al. |
| 6,436,766 | B1 | 8/2002 | Rangarajan et al. |
| 6,436,768 | B1 | 8/2002 | Yang et al. |
| 6,438,031 | B1 | 8/2002 | Fastow |
| 6,438,035 | B1 | 8/2002 | Yamamoto et al. |
| 6,440,797 | B1 | 8/2002 | Wu et al. |
| 6,442,074 | B1 | 8/2002 | Hamilton et al. |
| 6,445,030 | B1 | 9/2002 | Wu et al. |
| 6,448,750 | B1 | 9/2002 | Shor et al. |
| 6,449,188 | B1 | 9/2002 | Fastow |
| 6,449,190 | B1 | 9/2002 | Bill |
| 6,452,438 | B1 | 9/2002 | Li |
| 6,455,896 | B1 | 9/2002 | Chou et al. |
| 6,456,528 | B1 | 9/2002 | Chen |
| 6,456,533 | B1 | 9/2002 | Hamilton et al. |
| 6,458,656 | B1 | 10/2002 | Park et al. |
| 6,458,677 | B1 | 10/2002 | Hopper et al. |
| 6,469,929 | B1 | 10/2002 | Kushnarenko et al. |
| 6,469,935 | B2 | 10/2002 | Hayashi |
| 6,472,706 | B2 | 10/2002 | Widdershoven et al. |
| 6,477,084 | B1 | 11/2002 | Eitan |
| 6,477,085 | B1 | 11/2002 | Kuo |
| 6,490,204 | B2 | 12/2002 | Bloom et al. |
| 6,496,414 | B2 | 12/2002 | Kasa et al. |
| 6,504,756 | B2 | 1/2003 | Gonzalez et al. |
| 6,510,082 | B1 | 1/2003 | Le et al. |
| 6,512,701 | B1 | 1/2003 | Hamilton et al. |
| 6,519,180 | B2 | 2/2003 | Tran et al. |
| 6,519,182 | B1 | 2/2003 | Derhacobian et al. |
| 6,522,585 | B2 | 2/2003 | Pasternak |
| 6,525,969 | B1 | 2/2003 | Kurihara et al. |
| 6,528,390 | B2 | 3/2003 | Komori et al. |
| 6,529,412 | B1 | 3/2003 | Chen et al. |
| 6,532,173 | B2 | 3/2003 | Lioka et al. |
| 6,535,020 | B1 | 3/2003 | Yin |
| 6,535,434 | B2 | 3/2003 | Maayan et al. |
| 6,537,881 | B1 | 3/2003 | Rangrjan et al. |
| 6,538,270 | B1 | 3/2003 | Randolph et al. |
| 6,541,816 | B2 | 4/2003 | Ramsbey et al. |
| 6,552,387 | B1 | 4/2003 | Eitan |
| 6,555,436 | B2 | 4/2003 | Ramsbey et al. |
| 6,559,500 | B2 | 5/2003 | Torii |
| 6,562,683 | B1 | 5/2003 | Wang et al. |
| 6,566,194 | B1 | 5/2003 | Ramsbey et al. |
| 6,566,699 | B2 | 5/2003 | Eitan |
| 6,567,303 | B1 | 5/2003 | Hamilton et al. |
| 6,567,312 | B1 | 5/2003 | Torii et al. |
| 6,570,785 | B1 | 5/2003 | Guterman et al. |
| 6,574,139 | B2 | 6/2003 | Kurihara |
| 6,577,514 | B2 | 6/2003 | Shor et al. |
| 6,577,532 | B1 | 6/2003 | Chevallier |
| 6,577,547 | B2 | 6/2003 | Ukon |
| 6,583,005 | B2 | 6/2003 | Hashimoto et al. |
| 6,583,007 | B1 | 6/2003 | Eitan |
| 6,583,479 | B1 | 6/2003 | Fastow et al. |
| 6,584,017 | B2 | 6/2003 | Maayan et al. |
| 6,590,811 | B1 | 7/2003 | Hamilton et al. |
| 6,593,606 | B1 | 7/2003 | Randolph et al. |
| 6,594,181 | B1 | 7/2003 | Yamada |
| 6,608,526 | B1 | 8/2003 | Sauer |
| 6,608,905 | B1 | 8/2003 | Muza et al. |
| 6,614,052 | B1 | 9/2003 | Zhang |

| | | | | | | |
|---|---|---|---|---|---|---|
| 6,614,295 B2 | 9/2003 | Tsuchi | | 7,043,672 B2 | 5/2006 | Merritt |
| 6,614,686 B1 | 9/2003 | Kawamura | | 7,075,146 B2 * | 7/2006 | Forbes ........................ 257/330 |
| 6,614,692 B2 | 9/2003 | Maayan et al. | | 7,079,420 B2 | 7/2006 | Shappir et al. |
| 6,617,179 B1 | 9/2003 | Kim | | 7,116,577 B2 | 10/2006 | Eitan |
| 6,617,215 B1 | 9/2003 | Halliyal et al. | | 7,218,554 B2 * | 5/2007 | Hsu et al. ............... 365/185.25 |
| 6,618,290 B1 | 9/2003 | Wang et al. | | 7,321,145 B2 * | 1/2008 | Yeh et al. ..................... 257/296 |
| 6,624,672 B2 | 9/2003 | Confaloneri et al. | | 7,518,908 B2 * | 4/2009 | Maayan et al. ......... 365/185.02 |
| 6,627,555 B2 | 9/2003 | Eitan et al. | | 2001/0006477 A1 | 7/2001 | Banks |
| 6,630,384 B1 | 10/2003 | Sun et al. | | 2002/0004878 A1 | 1/2002 | Norman |
| 6,633,496 B2 | 10/2003 | Maayan et al. | | 2002/0004921 A1 | 1/2002 | Muranaka et al. |
| 6,633,499 B1 | 10/2003 | Eitan et al. | | 2002/0064911 A1 | 5/2002 | Eitan |
| 6,633,956 B1 | 10/2003 | Mitani | | 2002/0132436 A1 | 9/2002 | Eliyahu et al. |
| 6,636,440 B2 | 10/2003 | Maayan et al. | | 2002/0140109 A1 | 10/2002 | Keshavarzi et al. |
| 6,639,271 B1 | 10/2003 | Zheng et al. | | 2002/0145465 A1 | 10/2002 | Shor et al. |
| 6,639,837 B2 | 10/2003 | Takano et al. | | 2002/0191465 A1 | 12/2002 | Maayan et al. |
| 6,639,844 B1 | 10/2003 | Liu et al. | | 2002/0199065 A1 | 12/2002 | Subramoney et al. |
| 6,639,849 B2 | 10/2003 | Takahashi et al. | | 2003/0001213 A1 | 1/2003 | Lai |
| 6,642,148 B1 | 11/2003 | Ghandehari et al. | | 2003/0021155 A1 | 1/2003 | Yachareni et al. |
| 6,642,573 B1 | 11/2003 | Halliyal et al. | | 2003/0072192 A1 | 4/2003 | Bloom et al. |
| 6,642,586 B2 | 11/2003 | Takahashi | | 2003/0076710 A1 | 4/2003 | Sofer et al. |
| 6,643,170 B2 | 11/2003 | Huang et al. | | 2003/0117841 A1 | 6/2003 | Yamashita |
| 6,643,177 B1 | 11/2003 | Le et al. | | 2003/0131186 A1 | 7/2003 | Buhr |
| 6,643,178 B2 | 11/2003 | Kurihara | | 2003/0134476 A1 | 7/2003 | Roizin et al. |
| 6,643,181 B2 | 11/2003 | Sofer et al. | | 2003/0142544 A1 | 7/2003 | Maayan et al. |
| 6,645,801 B1 | 11/2003 | Ramsbey et al. | | 2003/0145176 A1 | 7/2003 | Dvir et al. |
| 6,649,972 B2 | 11/2003 | Eitan | | 2003/0145188 A1 | 7/2003 | Cohen et al. |
| 6,650,568 B2 | 11/2003 | Iijima | | 2003/0155659 A1 | 8/2003 | Verma et al. |
| 6,653,190 B1 | 11/2003 | Yang et al. | | 2003/0190786 A1 | 10/2003 | Ramsbey et al. |
| 6,653,191 B1 | 11/2003 | Yang et al. | | 2003/0197221 A1 | 10/2003 | Shinozaki et al. |
| 6,654,296 B2 | 11/2003 | Jang et al. | | 2003/0202411 A1 | 10/2003 | Yamada |
| 6,664,588 B2 | 12/2003 | Eitan | | 2003/0206435 A1 | 11/2003 | Takahashi |
| 6,665,769 B2 | 12/2003 | Cohen et al. | | 2003/0208663 A1 | 11/2003 | Van Buskirk et al. |
| 6,670,241 B1 | 12/2003 | Kamal et al. | | 2003/0209767 A1 | 11/2003 | Takahashi et al. |
| 6,670,669 B1 | 12/2003 | Kawamura | | 2003/0214844 A1 | 11/2003 | Iijima |
| 6,674,138 B1 | 1/2004 | Halliyal et al. | | 2003/0218207 A1 | 11/2003 | Hashimoto et al. |
| 6,677,805 B2 | 1/2004 | Shor et al. | | 2003/0218913 A1 | 11/2003 | Le et al. |
| 6,680,509 B1 | 1/2004 | Wu et al. | | 2003/0222303 A1 | 12/2003 | Fukuda et al. |
| 6,686,242 B2 | 2/2004 | Willer et al. | | 2003/0227796 A1 | 12/2003 | Miki et al. |
| 6,690,602 B1 | 2/2004 | Le et al. | | 2004/0007730 A1 | 1/2004 | Chou et al. |
| 6,693,483 B2 | 2/2004 | Deml et al. | | 2004/0010737 A1 | 1/2004 | Merritt |
| 6,700,818 B2 | 3/2004 | Shappir et al. | | 2004/0012993 A1 | 1/2004 | Kurihara |
| 6,717,207 B2 | 4/2004 | Kato | | 2004/0013000 A1 | 1/2004 | Torii |
| 6,723,518 B2 | 4/2004 | Papsidero et al. | | 2004/0014280 A1 | 1/2004 | Willer et al. |
| 6,731,542 B1 | 5/2004 | Le et al. | | 2004/0014290 A1 | 1/2004 | Yang et al. |
| 6,738,289 B2 | 5/2004 | Gongwer et al. | | 2004/0021172 A1 | 2/2004 | Zheng et al. |
| 6,744,692 B2 | 6/2004 | Shiota et al. | | 2004/0027858 A1 | 2/2004 | Takahashi et al. |
| 6,765,259 B2 | 7/2004 | Kim | | 2004/0151034 A1 | 8/2004 | Shor et al. |
| 6,768,165 B1 | 7/2004 | Eitan | | 2004/0153620 A1 | 8/2004 | Eisen et al. |
| 6,781,876 B2 | 8/2004 | Forbes et al. | | 2004/0153621 A1 | 8/2004 | Polansky et al. |
| 6,788,579 B2 | 9/2004 | Gregori et al. | | 2004/0157393 A1 | 8/2004 | Hwang |
| 6,791,396 B2 | 9/2004 | Shor et al. | | 2004/0222437 A1 | 11/2004 | Avni et al. |
| 6,794,249 B2 | 9/2004 | Palm et al. | | 2005/0057953 A1 | 3/2005 | Lusky et al. |
| 6,794,280 B2 | 9/2004 | Chang | | 2005/0078527 A1 | 4/2005 | Liu et al. |
| 6,818,956 B2 | 11/2004 | Kuo et al. | | 2005/0117395 A1 | 6/2005 | Maayan et al. |
| 6,829,172 B2 | 12/2004 | Bloom et al. | | 2005/0117601 A1 | 6/2005 | Anderson et al. |
| 6,831,872 B2 | 12/2004 | Matsuoka | | 2005/0140405 A1 | 6/2005 | Do et al. |
| 6,836,431 B2 | 12/2004 | Chang | | 2005/0213593 A1 | 9/2005 | Anderson et al. |
| 6,859,028 B2 | 2/2005 | Toner | | 2005/0232024 A1 | 10/2005 | Atir et al. |
| 6,870,772 B1 | 3/2005 | Nitta et al. | | 2006/0084219 A1 | 4/2006 | Lusky et al. |
| 6,871,258 B2 | 3/2005 | Micheloni et al. | | 2006/0126382 A1 | 6/2006 | Maayan et al. |
| 6,885,585 B2 | 4/2005 | Maayan et al. | | 2006/0126383 A1 | 6/2006 | Shappir et al. |
| 6,885,590 B1 | 4/2005 | Zheng et al. | | 2006/0131634 A1 * | 6/2006 | Hsu et al. .................... 257/315 |
| 6,906,357 B1 | 6/2005 | Vashchenko et al. | | 2007/0195607 A1 * | 8/2007 | Eitan et al. .............. 365/185.24 |
| 6,912,160 B2 | 6/2005 | Yamada | | | | |
| 6,917,544 B2 | 7/2005 | Maayan et al. | | FOREIGN PATENT DOCUMENTS | | |
| 6,928,001 B2 | 8/2005 | Avni et al. | | | | |
| 6,930,928 B2 | 8/2005 | Liu et al. | | EP | 0693781 | 1/1996 |
| 6,937,523 B2 | 8/2005 | Eshel | | EP | 0 822 557 | 2/1998 |
| 6,954,393 B2 | 10/2005 | Lusky et al. | | EP | 0 843 398 | 5/1998 |
| 6,967,872 B2 | 11/2005 | Quader et al. | | EP | 0580467 | 9/1998 |
| 6,967,896 B2 | 11/2005 | Eisen et al. | | EP | 0461764 | 7/2000 |
| 6,975,536 B2 | 12/2005 | Maayan et al. | | EP | 1 071 096 | 1/2001 |
| 6,996,692 B2 | 2/2006 | Kouno | | EP | 1073120 | 1/2001 |

| | | |
|---|---|---|
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 05-326893 | 12/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-118392 | 4/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 96/1553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |
| WO | WO 03/100790 | 12/2003 |

OTHER PUBLICATIONS

Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987. vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Tanaka et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.
Ma at al., A Dual-bit Split-Gate EEPROM (DSG) Cell in Contactless Array for Single-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, p. 521-524, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Members for Digital Applications, Dec. 1998, 2399-2421, vol. 86, No. 12, Institute of Electrical and Electronics Engineers, Inc.
Martin, Improved Circuits for the Realization of Switched-Capacltor Filters, IEEE Transactions on Circuits and Systems, Apr. 1980, 2370244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.
2 Bit/Cell EEPROM Cell Using Band-To-Band Tunneling for Data Read-Out, IBM Technical Disclosure Bulletin, 1992, 136-140, vol. 35, No. 4B.
Umezawa, et al., A 5-V-Only Operation 0.6-µm Flash EEPROM with Row Decoder Scheme in Triple-Well Structure, IEEE Journal of Solid-State Circuits, 1992, 1540, vol. 27.
Mitchell, et al., A new self-aligned planar array cell for ultra high density EPROMS, 1987.
Esquivel, et al., High Density Contactless, Self Aligned EPROM Cell Array Technology, 1986.
Johns, Martin, Analog Integrated Circuit Designl, Jun. 1, 1997, Chapter 10, John Wiley and Sons Inc.
Allen, et al., CMOS Analog Circuit Design, 2002, 259pages, Oxford University Press.
Klinke, et al., A very-hIgh-slew-rate CMOS operational amplifier, IEEE Journal of Solid-State Circuits, 1989, 744-746, 24 vol.
Shor, et al, paper WA2.04.01—Self regulated Four phased charge pump with boosted wells, ISCAS 2002.
Fotouhi, An efficient CMOS line driver for 1.544-Mb/s T1 and 2.048-Mb/S E1 applications, IEEE Journal of Solid-State Circuits, 2003, 226-236pages, 38vol.
P-N Junction Diode, Physics of semiconductor devices, 1981, ch. 2, "A Wiley-Interscience Publication", John Wiley & Sons Publishers.
Chang, Non Volatile Semiconductor Memory Devices, Proceedings of the IEEE, 64 vol., No. 7 , pp. 1039-1059; Jul. 1976.
Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 26, No. 12, Dec. 2004, pp. 810-812.

"Design Considerations in Scaled SONOS Nonvolatile Memory Devices" Bu, Jiankang et al. , Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

"SONOS Nonvolatile Semiconductor Memories for Space and Military Applications", Adams et al., Symposium, 2000. http://klabs.org/richcontent/MemoryContent/nvmt_symp/nvmts_2000/papers/adams_d.pdf.

"Philips Research—Technologies—Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd. 1110 pgs.

* cited by examiner

Channel Hot Electron (CHE) Injection
in a floating gate memory cell

Fowler-Nordheim Tunneling (FNT)
in a floating gate memory cell

CHE programming the
right bit of an NROM

CHE programming the
left bit of an NROM

HHI erasing the
right bit of an NROM

HHI erasing the
left bit of an NROM erase to high Vt by negative FNT

HHI to decrease Vt (left)

HHI to decrease Vt (right)

FNT Erase

HHI Program

CHE Refresh

CHE Refresh (cont.)

HHI Program

CHE Refresh

US 7,692,961 B2

METHOD, CIRCUIT AND DEVICE FOR DISTURB-CONTROL OF PROGRAMMING NONVOLATILE MEMORY CELLS BY HOT-HOLE INJECTION (HHI) AND BY CHANNEL HOT-ELECTRON (CHE) INJECTION

CROSS-REFERENCE TO RELATED APPLICATIONS

This is a non-provisional filing of U.S. Provisional Application No. 60/774,609, filed 21 Feb. 2006 by Boaz Eitan, incorporated in its entirety by reference herein.

Cross-reference is made to commonly-owned, copending U.S. patent application Ser. No. 11/462,006, by Boaz Eitan, entitled "NROM Mode of Operation (FNT erase & HHI+ CHE program)", filed on even date herewith.

TECHNICAL FIELD

This disclosure relates to nitride read only memory (NROM) and other ONO (oxide-nitride-oxide) cells and other microelectronic devices and structures and, more particularly, to modes of operating (particularly erasing and programming) NROM cells.

BACKGROUND

Demand for non-volatile memory (NVM) devices, including embedded NVM in other microelectronics and IC devices, has grown rapidly in recent years due to the expansion of digital computing and processing beyond desktop computer systems to include a broader array of consumer electronic, communications, automotive and industrial products. These products include mobile phones, still and video digital cameras, personal digital assistants (PDAs), portable computers, portable digital music players, digital video recorders, set-top boxes, communication routers and switches, digital televisions and other electronic systems. Each of these products typically requires one or more non-volatile memory device(s) to store data, such as the product's operating system and may also require data storage capabilities. The flash memory market, which in 2004 was the largest segment of the non-volatile semiconductor memory market, has traditionally been divided into four segments: code flash, data flash, embedded flash and serial flash.

Historically, the most widely-used technology for non-volatile semiconductor memory devices is floating gate technology, which was developed in the late 1960s and has been the prevalent technology for non-volatile semiconductor memory devices since then. A floating gate device is a variation of a standard metal oxide semiconductor (MOS) field effect transistor (FET) in that it has an additional electrically isolated "floating gate," made of a conductive material. A floating gate device stores information by holding electrical charge within the floating gate. Adding or removing charge from the floating gate changes the threshold voltage (Vt) of the cell thereby defining whether the memory cell is in a programmed or erased state—representing a binary "1" or a binary "0" (memory cell states which may also be referred to herein as logic "1" and logic "0"), respectively or, conversely, binary or logic "0" and binary or logic "1", respectively (the definition of the erase and program states as binary or logic "1" and binary or logic "0" being somewhat arbitrary, and generally at a designer's/manufacturer's discretion).

NROM technology effectively doubles the storage capacity of each memory cell by enabling the storage of two physically distinct and independent charges, each representing one bit of information, within a single memory cell. This significantly reduces the amount of silicon wafer required for each non-volatile memory device, resulting in a significant cost reduction to semiconductor manufacturers. Further advances in NROM and related ONO technology increase storage capacity to more than two bits (binary digits) per cell by better control and/or characterization of trapped charge.

Non-volatile memory devices based on NROM or other ONO (such as SONOS) technology contain a trapping nitride layer which stores a charge, instead of a floating gate suspended above the cell. The nitride layer is usually surrounded by two insulating silicon dioxide layers (oxide). Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NROM and related technologies may be found at "Non Volatile Memory Technology", 2005 published by Saifun Semiconductor and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at: http://klabs.org/richcontent/MemoryContent/nvmt_symp/nvmts_2000/papers/adams_d.pdf, "Philips Research-Technologies-Embedded Nonvolatile Memories" found at: http://research.philips.com/technologies/ics/nvmemories/index.html, and "Semiconductor Memory: Non-Volatile Memory (NVM)" found at: http://ece.nus.edu.sg/stfpage/elezhucx/mvweb/NVM.pdf, all of which are incorporated by reference herein in their entirety.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell. MLC operation of memory cells is discussed in greater detail hereinbelow.

A Two-Bit (Dual Bit) Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, as discussed in greater detail hereinbelow, at least two bits can be stored in and read from each of the two portions of the charge-trapping medium (for a total of 4 bits), similarly 3 bits or more than 4 bits may be identified.

FIG. 3 illustrates a basic NROM memory cell, which may be viewed as an FET with an "ONO" structure inserted between the gate and the substrate. (One might say that the ONO structure is "substituted" for the gate oxide of the FET.)

The ONO structure is a stack (or "sandwich") of lower oxide 322, a charge-trapping material such as nitride 324, and an upper oxide 326. The ONO structure may have an overall thickness of approximately 10-25 nm, such as 18 nm, as follows:

the bottom oxide layer 322 may be from 3 to 6 nm, for example 4 nm thick;

the middle nitride layer 324 may be from 3 to 8 nm, for example 4 nm thick; and the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate between the two diffusion regions 314 and 316.

The charge-trapping material 324 is non-conductive, and therefore, although electrical charges can be stored in the charge-trapping material, they are not free to move around, they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

The memory cell 300 is generally capable of storing two bits of data, a right bit in an area of the nitride layer 324 represented by the dashed circle 323 and a left bit in an area of the nitride layer 324 represented by the dashed circle 321. (MLC operation of the NROM, for storing a total of 4 bits of data is discussed hereinbelow.)

Each of the storage areas 321, 323 in the charge-trapping material 324 can exert a field effect on the channel region 320 between the source and the drain, in a manner similar to how a normal FET works, as described hereinabove (FIG. 2). some mechanisms for storing in the storage areas of the charge-trapping material, as well as removing charges from the storage areas of the charge-trapping material are described hereinbelow.

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed to that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is. Some modes of operation for an NROM memory cell are described hereinbelow.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction. Some programming and reading modes of operation for memory cells are described hereinbelow.

Memory Cell Modes of Operation and Injection Mechanisms

A memory cell's state may be defined and determined by what is called its threshold voltage (Vt) which determines a threshold level for the gate voltage required to establish the "channel" between the source and the drain—in other words, for the memory cell to begin to conduct current. A memory cell's threshold voltage level is directly related to the amount of charge (the number of electrons) stored in the charge storage region (floating gate, or ONO layer) of the cell—generally, more electrons stored means a higher threshold voltage Vt. Typically, for a given structure of a memory cell, the gate voltage that provides 1 pA (picoAmpere) of channel current is termed the threshold voltage (Vt).

The structure and general operation of two types of memory cells—floating gate and NROM—have been described hereinabove, with reference to FIG. 2 (floating gate) and FIG. 3 (NROM). Fundamentally, these two types of memory cells have in common with one another that they both operate very generally as a field effect transistor (FET)—namely, having two spaced-apart diffusion regions (functioning as source and drain) and a gate (for controlling the flow of electrons (current) through the channel region between the two diffusion areas, with the modification that they both have a charge storage structures under the gate.

The floating gate (FG) memory cell has a conductive layer between the gate and the channel region and, since the floating gate is a conductor, electrical charges stored in the floating gate are free to move around within the floating gate.

The NROM memory cell has a non-conductive layer (such as nitride) which can store charge in distinct areas and, since the non-conductive layer is not a conductor, the charges stored in the non-conductive layer are not free to move around, but rather tend to stay more-or less where they have been stored in a charge-storage region of the non-conductive layer, typically in a first region near one of the two diffusion regions, and in a second region adjacent the other of the two diffusion regions. These two diffusion regions are typically referred to as "left" and "right", and the corresponding two charge-storage regions in the non-conductive layer are typically similarly referred to as "left" and "right".

The concept of storing charges in the charge-storage structures (floating gate of a floating gate memory cell, or non-conductive layer of an NROM memory cell) has been discussed. The charges can also be removed from the charge-storage structure. Generally, the process of moving of charges into or out of the charge-storage structure is referred to as "injection", and there are a number of known injection mechanisms.

In a general sense, "electrons" are (or behave as) negative charges and "holes" are (or behave as) positive charges. As we have heard many times in many contexts, "opposites attract". For example, the north pole of a magnet attracts the south pole of another magnet, and is repelled by the north pole of another magnet. Generally, the same principle applies with electrical charges. An electron (negative charge) will be attracted by a positive electrical charge (or voltage) and will be repelled by a negative electrical charge (or voltage), and a hole (positive charge) will be attracted by a negative electrical charge (or voltage) and will be repelled by a positive electrical charge (or voltage).

The charge-storage structures of both the floating gate (FIG. 2) or NROM (FIG. 3) memory cells are separated from the channel region between the two diffusion regions by an insulating material, typically silicon dioxide (see tunnel oxide, FIG. 2; See lower oxide 322, FIG. 3). Therefore, in a general sense, the purpose of an injection mechanism is to move charges (electrons or holes) across the insulating material separating the channel region from the charge-storage structure of the memory cell.

The broad purpose of semiconductor memory is to store ("program") data—many binary "1"s and "0"s—and allow access to ("read") the stored data. And the broad purpose of a single memory cell is to store individual bits of the data. Single-level (SLC) floating gate memory cells can store one bit of data. Single-level (SLC) NROM memory cells can store two bits of data. Multi-level (MLC) floating gate memory cells can store two bits of data. Multi-level (MLC) NROM memory cells can store four bits of data. MLC operation of memory cells is discussed in greater detail hereinbelow.

Data is stored in and retrieved from memory cells in what is termed "modes of operation". Generally, there are four modes of operation: "erase", "program", "write" and "read". The first three modes (erase, program, write) relate to storing data. And, for purposes of this discussion, the write mode typically is simply a combination of erase and program. The read mode refers to accessing stored data.

The principle modes of operation discussed in this disclosure are program and erase. Both floating gate and NROM will be discussed.

Generally, to store a charge in the floating gate of a floating gate memory cell, the control gate's voltage may be raised with the source and drain grounded (or with the drain at a raised voltage), so that electrons tunnel through the tunnel oxide from the channel region to the floating gate, by a process known as CHE (channel hot electron) injection. To remove the charge (electrons) from the floating gate, the source's voltage may be raised with the gate grounded (or at a negative potential), and the electrons tunnel from the floating gate back to the substrate, by a process known as F-N (Fowler-Nordheim) tunneling (also abbreviated "FNT").

FIG. 2A illustrates a technique for programming a floating gate memory cell, using channel hot electron (CHE) injection to put charges (inject electrons) into the floating gate. The floating gate memory cell generally comprises a channel region between a source region and a drain region, and a floating gate disposed between the channel region and the control gate (compare FIG. 2). This figure illustrates various voltages which may be applied to the source (Vs), to the gate (Vg) and to the drain (Vd), from external sources and/or connections (not shown). Generally, there is no "connection" to the floating gate.

Generally, in order implement CHE injection of electrons into the floating gate, the source is grounded, the drain is set to zero or to a positive voltage (which will "attract" electrons from the source, laterally across the channel region), and the gate is also set to a positive voltage (which will "attract" electrons vertically through the tunnel oxide, into the floating gate). As electrons flow through the channel from source to drain, some of the electrons will make their way through the tunnel oxide and become stored on the floating gate. This injection of electrons into the floating gate increases the threshold voltage of the memory cell. The shift (increase) in threshold voltage can be on the order of 3 or more volts. The threshold voltage (Vt) of the memory cell can later be measured, or "read".

FIG. 2B illustrates a technique for erasing a floating gate memory cell, using a mechanism which is called "Fowler-Nordheim Tunneling", abbreviated as "F-N tunneling", or "FN tunneling", or simply "FNT".

Generally, whereas CHE injection was used (described hereinabove), in programming, to inject electrons into the floating gate, F-N tunneling (FNT) is used, in the erase operation, to remove electrons from the floating gate.

Generally, in order implement F-N tunneling of removing electrons from the floating gate, both the source and the drain are set to a positive voltage (to "attract" electrons through the tunnel oxide from the floating gate into the substrate), and the gate is set to a negative voltage (to "repel" electrons through the tunnel oxide from the floating gate into the substrate). This removal of electrons from the floating gate decreases the "threshold voltage" of the memory cell.

Generally, during programming, the threshold voltages of individual memory cells or (in the case of NROM) two charge-storage regions of a single memory cell are individually manipulated to represent the data desired to be stored. In contrast thereto, generally, during erase, it is normally acceptable to simply decrease the threshold voltages of a great many memory cells, all at once, such as all of the memory cells in a sector or block of a memory array.

Typically, to inhibit erase of selected memory cells, an "inhibit" signal, such as a positive voltage (which will not "repel" the electrons) may be applied to the gates of the selected memory cells. In a common array architecture, the gates of several memory cells are typically all connected to a common word line (of many such word lines) in the array. Array architecture is discussed in greater detail hereinbelow.

Regarding "reading" the contents of a memory cell, no "injection mechanism" is used. The conventional technique of reading conductive floating gate memory cells is to apply appropriate "read voltages" to the gate and drain and to ground the source. This is similar to the method of programming with the difference being that lower level voltages are applied during reading than during programming.

Since the floating gate is conductive, the trapped charge is distributed evenly throughout the entire floating conductor. In a programmed device, the threshold is therefore high for the entire channel and the process of reading becomes symmetrical.

It makes no difference whether voltage is applied to the drain and the source is grounded or vice versa.

The following table presents exemplary conditions for programming, erasing and reading a floating gate memory cell.

TABLE 1

Exemplary Floating Gate Conditions

|  | Vs | Vg | Vd | Vb | time |
|---|---|---|---|---|---|
| Erase (FN) | >=0 | −8-10 v | >=0 | 6-8 v | 100 ms |
| Program (CHE) | gnd | 8-10 v | 4-5 v | ?? | 1 μs |
| Read | 0 v | 5 v | 1 v |  |  |

FIGS. 3A and 3B illustrate a technique for programming an NROM memory cell, using channel hot electron (CHE) injection to inject electrons into the charge storage areas 321 and 323. As shown in FIG. 3A, the NROM memory cell comprises a channel region between two spaced-apart diffusion regions (left and right), and an ONO stack (322, 324, 326) between the channel region and the gate (328). (Compare FIG. 3.)

Generally, NROM memory cells may be programmed similarly to floating gate memory cells, using a channel hot electron (CHE) injection mechanism. Voltages are applied to the gate and drain creating vertical and lateral electrical fields which accelerate electrons from the source along the length of the channel. As the electrons move along the channel some of them gain sufficient energy to jump over the potential barrier of the bottom silicon dioxide layer 322 (of the ONO layer) and become trapped in the silicon nitride (charge trapping) layer 324 (of the ONO layer).

The NROM cell can store charges in two separate portions 321 and 323 of the charge-trapping layer 324. For purposes of this portion of the discussion, the left region 321 stores a left bit, and the right region 323 stores a right bit. Depending on which bit is desired to be programmed, the left and right diffusion regions 314 and 316 can act as source and drain, or as drain and source. The gate always functions as the gate.

FIG. 3A illustrates CHE programming of the right bit. In this example, electron trapping occurs in a region near the diffusion region 316 acting as a drain, as indicated by the dashed circle 323. Electrons are trapped in the portion 323 of nitride layer 324 near but above and self-aligned with the drain region 316 because the electric fields are the strongest there. Thus, the electrons have a maximum probability of being sufficiently energized to jump the potential barrier of the oxide layer 322 and become trapped in the nitride layer 324 near the drain 316.

FIG. 3B illustrates CHE programming of the left bit. For the left bit, the situation is reversed from programming of the right bit. In simple terms, the left diffusion area 314 functions as the drain and the right diffusion area 316 functions as the source, and electrons are sufficiently energized to jump the potential barrier of the oxide layer 322 and become trapped in the nitride layer 324 near the drain 314.

Generally, NROM memory cells may be erased using a technique called hot hole injection (HHI), or tunnel enhanced hot hole (TEHH) injection. For example, to erase an NROM memory cell, the source voltage can be set to a positive voltage such as +5 v, the gate voltage can be set to a negative voltage such as −7 v, and the drain voltage may be set to a positive voltage such as +2 volts (less than the source voltage) or may be left floating or disconnected.

Using HHI, holes (the "counterpart" of electrons) can be selectively inserted into the left portion 321 of the nitride layer 324 and into the right portion 323 of the nitride layer 324, in a controlled manner. Generally, holes which are injected cancel out electrons which are trapped (stored) in the left and right portions of nitride layer on a one-to-one basis (one hole "cancels out" one electron).

FIG. 3C illustrates erasing the right bit. In this example, hole injection occurs in a region near the diffusion region 316 acting as a drain, as indicated by the dashed circle 323. Holes are injected in the portion 323 of nitride layer 324 near but above and self-aligned with the drain region 316 because the electric fields are the strongest there. Thus, the holes have a maximum probability of being sufficiently energized to jump the potential barrier of the oxide layer 322 and become injected into the nitride layer 324 near the drain 316.

FIG. 3D illustrates HHI erasing of the left bit. For the left bit, the situation is reversed from erasing of the right bit. In simple terms, the left diffusion area 314 functions as the drain and the right diffusion area 316 functions as the source, and holes are sufficiently energized to jump the potential barrier of the oxide layer 322 and become injected into in the nitride layer 324 near the drain 314.

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323, electrons flow from left (source) to right (drain). To read the right storage area 323 (in other words, to read the right "bit"), voltages are applied to cause electrons to flow from right to left, in the opposite or reverse direction. For example, generally, to program the left storage area 321, electrons flow from right (source) to left (drain). To read the left storage area 321 (in other words, to read the left "bit"), voltages are applied to cause electrons to flow from left to right, in the opposite or reverse direction. See, for example, commonly-owned U.S. Pat. No. 6,768,165.

The following table presents exemplary conditions for programming, erasing and reading an NROM memory cell.

TABLE 2

Exemplary NROM Gate Conditions

|  | Vs | Vg | Vd | Vb | time |
|---|---|---|---|---|---|
| Program (CHE) | +5 v | 8-10 v | 0 v |  | 1 μs |
| Erase (HHI) | 5 v | −7 v | 2 v |  | ?? |
| Read | 0 | 5 v | 1.3 v |  |  |

"Vs" refers to the left diffusion area, and "Vd" refers to the right diffusion area, for the operations of programming, erasing and reading the right side bit of an NROM memory cell.

The operations of program and erase are typically performed using pulses, each pulse partially moving (nudging) the memory cell towards the desired Vt, followed by verify (a quick read, to see if the desired Vt has been reached), until the desired Vt has been attained. Typically, conditions are established so that only a few (for example, 3-5) pulses are required to program or erase each cell.

Exemplary operating modes for memory cells, using the mechanism of CHE injection for programming a memory cell, and the mechanisms of FNT and HHI for erasing a memory cell have been described, hereinabove. Other and additional mechanisms are known for performing the modes of operation.

Other Erase and Program Operations for NROM

The article "A Single-Sided PHINES SONOS Memory Featuring High-Speed and Low-Power Applications", IEEE Electron Device Letters, Vol. 27, No. 2, February 2006, incorporated in its entirety by reference herein, discloses erase and program operations for a memory cell having ONO thicknesses of 5 nm (bottom oxide), 7 nm (nitride) and 9 nm (top oxide), and being operated as a one-bit/cell device used in a virtual ground array. As noted in the article, CHE programming has low programming efficiency and causes high power consumption.

First the memory cell is erased to a high Vt level by a negative FN electron tunneling operation wherein, a high negative voltage is applied to the gate of the memory cell in a single terminal (1-terminal) operation (the source and drain voltages are left at 0 volts), and electrons tunnel into the nitride charge storage area. See FIG. 3E.

The erase conditions set forth in the article are Vs=0 v; Vg=−20 v; Vd=0 v; Vb=0 v. See Table 3, below. An upward Vt shift of approximately 3 volts (from 0 to 3 volts) can be achieved in approximately 1 millisecond (1 ms).

The negative FNT erase operation being a single terminal operation, the entire charge storage area of the memory cell is populated with electrons. This is shown in FIG. 3E by the nitride layer being filled with electrons (represented as dashes in circles). And, when multiple memory cells are tied to a common word line, all of the memory cells tied to that word line will be erased. Erase is generally a "bulk", indiscriminate operation, intended to bring a plurality of memory cells to a predefined state (either logic "1" or logic "0"), at once.

Then, for programming the cell, band-to-band hot-holes (HHs) are injected to both the left side and the right side to decrease the cell Vt, and a programming speed as fast as 20 μs can be achieved. See FIGS. 3F, 3G.

Hot Hole Injection (HHI) is a two-terminal operation, so only one side can be done at a time. In FIG. 3F, holes (represented as plus signs in circles) fill the left side of the nitride layer, "canceling out" a like number of electrons. In FIG. 3G, holes (represented as plus signs in circles) fill the right side of the nitride layer, "canceling out" a like number of electrons. (In the diagrams of FIGS. 3F and 3G, the electrons are illustrated as being in the top oxide layer not because they are there—they aren't—but rather because they simply do not fit in the illustration within the nitride layer—where they are. The electrons are in the nitride layer, as shown in FIG. 3E.)

The program conditions set forth in the article are Vs=0 v; Vg=−10 v; Vd=0 v; Vb=0 v. See Table 3, below. A downward Vt shift of approximately 3 volts (from 0 to −3 volts) can be achieved in approximately 20 microseconds (20 μs).

Since the device channel stays off during both programming and erase operation, the power consumption is very low. The article claims to achieve a high programming throughput of 10 MB/s with low power (program current<10 nA/cell).

However, it should be realized that the memory cell is being used as a one-bit/cell device, rather than as a two-bits/cell device, as in NROM. (The article appears to claim that two-bits/cell can be achieved by MLC operation).

TABLE 3

Exemplary NROM Gate Conditions

|  | Vs | Vg | Vd | Vb | time |
|---|---|---|---|---|---|
| Erase (FNT) | 0 v | −20 v | 0 v | 0 v | 1 ms |
| Program (HHI) | 5 v | −10 v | 5 v | 0 v | 20 μs |

The erase and program operations may typically be performed using a few cycles of pulses followed by verify (read).

There are, of course, many nuances to each of the operations of memory cells discussed hereinabove. For example, repeated erasing of a memory cell can result in lowering the threshold voltage beyond zero, becoming negative, a condition known as "over-erase". And, particularly with regard to programming NROM memory cells in an array of many NROM cells, programming one bit of a given cell may disturb the state of a neighboring cell. These issues, as they may become relevant and pertinent, are discussed hereinbelow.

For example, U.S. Patent Publication No. US2005/0078527, incorporated in its entirety by reference herein, discloses a method of over-erase protection in a NROM device by performing a F-N tunneling program to provide additional electrons to the nitride charge-trapping layer (of a NROM device having an ONO layer) to increase the threshold voltage before a CHE program cycle or before a HHI erase cycle. The FNT step may be applied to individual NROM devices, or to a plurality of NROM devices.

Programming is typically performed in increments, with pulses of voltage—after each pulse, a verify operation occurs in which the threshold voltage level of the cell is measured (read). The general idea is to "nudge" the threshold voltage to the desired level, rather than over-shooting (over programming) or under-shooting (under programming) the desired level. With appropriate control mechanisms, only a few pulses (nudges) are required. A similar concept of cycles of pulse followed by verify until a desired Vt has been attained may sometimes be used during the erase operation, to avoid under-erase or over-erase. See, for example, commonly-owned U.S. Pat. Nos. 6,292,394; 6,396,741; 6,490,204; 6,552,387; 6,636,440; and 6,643,181.

Multi-Level Cell (MLC) Operation of Memory Cells

Mention has been made, hereinabove, of single level cell (SLC) and multi-level cell (MLC) operation, and it shall be described only briefly in this disclosure.

Theoretically, in order to determine the programmed state of a memory cell, only one voltage threshold is needed— either the threshold voltage (Vt) of the cell is below the threshold, or over the threshold (Vth). However, this simplistic approach can lead to ambiguities and false readings. This is in part due to the fact that the charges (such as electrons) cannot be stored (in the floating gate, or in the NROM storage region) with absolute precision, and is in part due to the fact that sometimes electrons disappear from the storage region.

Therefore, in practice, to store one bit of data, two voltage levels are needed. If the sensed threshold voltage is below the lower of the two voltage levels, that is classified as a "0", and if the sensed threshold voltage is above the higher of the two voltage levels, that is classified as a "1".

Memory cell technology has been developed wherein memory cells can hold two or more bits of data, instead of just one each, in the storage region. The trick is to take advantage of the analog nature of the charge stored in the memory cell and allow it to charge to several different voltage levels. Each voltage range to which the floating gate can charge can then be assigned its own digital code. This is generally referred to as "Multi-Level Cell (MLC)" technology.

Injection Mechanisms, Generally

A number of "injection mechanisms" have been described hereinabove, in the context of modes of operating memory cells, such as CHE, FNT, HHI.

Generally, an injection mechanism includes any mechanism that causes electrons to be inserted into the storage area (floating gate) of a floating gate memory cell, or into the left or right storage area (in the ONO layer) of an NROM memory cell, such as CHE and FNT.

Generally, the more electrons you can insert into the storage area, the higher the threshold voltage of the memory cell will be. For a single level cell (SLC), a threshold voltage Vt above a predefined level Vth may be designated to represent either a logic "1" or a logic "0", and a threshold voltage Vt below the predefined level Vth may be designated to represent either a logic "0" or a logic "1".

Generally, an injection mechanism also includes any mechanism that causes electrons to be removed (extracted) from the storage area (floating gate or ONO region) of a memory cell. Generally, the threshold voltage of the memory cell can be lowered by removing previously-inserted electrons from the storage area.

Another way to lower the threshold voltage of the memory cell is to "cancel out" the electrical charge effect of previously-inserted electrons in the storage area, and this may be accomplished by inserting holes into the storage area, such as with HHI. Generally, one hole will "cancel out" one electron.

These injection mechanisms are generally well known. Although the mechanisms may largely be dominated by the various voltages applied to the source (Vs), gate (Vg) and drain (Vd) of the memory cell, as well as to the substrate (Vb), factors such as materials used in various elements of the memory cell, as well as geometry and dimensions of the elements of the memory cell can also significantly affect the injection mechanism.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

This means that if you want to perform an operation (such as program, erase or read) on one cell something, there could be an effect on a neighboring cell, since two of the three terminals of adjacent memory cells are connected together (gate connected to gate, and one of left/right diffusions connected to one of right/left diffusions for the neighboring cell.)

Generally, as discussed in greater detail hereinbelow, it may be relevant whether a given operation (such as program, erase or read) is performed as a "I-terminal" operation (such as FNT erase to high Vt, discussed hereinabove), as a "2-terminal" operation (for example, applying a non-zero voltage to the gate and to one of the source or drain diffusions) or as a "3-terminal" operation (for example, applying a non-zero voltage to the gate and to both of the source or drain diffusions).

Generally, when programming or erasing a cell, one or more of the neighboring cells may be affected by the programming/erasing operation, causing thereto a possible change in their threshold voltage. This unwanted change in threshold voltage of unselected cells is known as a "disturb". A similar effect (disturb) may occurs during a read operation. However, due to the relative weakness of the applied voltage levels, the effect during read is significantly smaller.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

A memory array may also include isolation zones (not shown). Isolation zones segregate one group of memory cells from a neighboring group of memory cells, for example isolation zones can divide the array into slices of just one column or a plurality of columns. Examples of arrays having isolation zones may be found in commonly-owned U.S. Pat. No. 7,043,672, incorporated in its entirety by reference herein, and in coinmonly-owned U.S. Pat. No. 6,975,536.

A more complete description of NROM and similar ONO cells and devices, as well as processes for their development may be found at "Non Volatile Memory Technology", 2005 published by Saifun Semiconductor and materials presented at and through http://siliconnexus.com, both incorporated by reference herein in their entirety.

GLOSSARY

Unless otherwise noted, or as may be evident from the context of their usage, any terms, abbreviations acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page".

bit line (BL) a conductor connected to the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, e.g., kilobyte (KB), megabyte (MB) and gigabyte (GB).

CHE short for channel hot electron. CHE is an "injection mechanism".

CMOS short for complementary metal oxide semiconductor. CMOS consists of n-channel and p-channel MOS transistors. Due to very low power consumption and dissipation as well minimization of the current in "off" state CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel one and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

EEPROM short for electrically erasable, programmable read only memory.

EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

Flash memory Flash memory is a form of non-volatile memory (EEPROM) that can be electrically erased and reprogrammed. Flash memory architecture allows multiple memory locations to be erased or written in one programming operation.

FN tunneling Field emission—also called Fowler-Nordheim tunneling—is the process whereby electrons tunnel through a barrier in the presence of a high electric field. This quantum mechanical tunneling process is an important mechanism for thin barriers as those in metal-semiconductor junctions on highly-doped semiconductors. Using FN tunneling, electrons can be moved to the floating gate of a MOSFET memory cell.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si).

n-type semiconductor in which concentration of electrons is higher than the concentration of "holes". See p-type.

NROM short for nitride read only memory.

NVM short for non-volatile memory. NVM is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of a NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of thermally insulating oxide, and charge-trapping nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD.

p-type semiconductor in which concentration of "holes" is higher than the concentration of electrons. See n-type. Examples of p-type silicon include silicon doped (enhanced) with boron (B), Indium (In) and the like.

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

ROM short for read-only memory.

Si Silicon, a semiconductor.

SONOS Si-Oxide-Nitride-Oxide-Si, another way to describe ONO with the Si underneath and the Poly gate on top.

TEHH short for Tunnel Enhanced Hot Hole injection. TEHH is an "injection mechanism".

Units of Length Various units of length may be used herein, as follows:
  meter (m) A meter is the SI unit of length, slightly longer than a yard.
    1 meter=~39 inches. 1 kilometer (km)=1000 meters=~0.6 miles. 1,000,000 microns=1 meter. 1,000 millimeters (mm)=1 meter.
    100 centimeters (cm)=1 meter.
  micron (μm) one millionth of a meter (0.000001 meter); also referred to as a micrometer.
  mil 1/1000 or 0.001 of an inch; 1 mil=25.4 microns.
  nanometer (nm) one billionth of a meter (0.000000001 meter).
  Angstrom (Å) one tenth of a billionth of a meter. 10 Å=1 nm.

word line (WL) a conductor normally connected to the gate of a memory cell transistor.

In addition to the above, some abbreviations that may be used herein, or in the provisional application from which this non-provisional application claims priority, may include:

Erase a method to erase data on a large set of bits in the array, by applying voltage scheme that inject holes in the bit set. This method causes all bits to reach a low Vt level.

Program a method to program a bit in an array, by applying a voltage scheme that injects electrons. This method causes an increase in the Vt of he bit we program.

Write a combined method of first erase a large set of bits, then program a new data into the bit set.

Read read the digital data stored in the array

Verify a read operation after applying program or erase pulse, that checks if the applied program or erase pulse moved the Vt to the target level (program-verify or erase-verify level)

Refresh a part of the program or erase algorithms that checks the status of bits and applies pulses to bits that may have lost some of their Vi due to reliability margin loss.

Over-erase a condition that happens to some bits in a large bit set that are erased together, due to erase speed difference, due to the situation that some bits erase faster than other bits. Fast bits are particularly susceptible to over-erase.

Disturb when applying a pulse to a specific bit b raising WL and BL voltages, neighbor bits located on the same WL or same BL might suffer from Vt shift that cause margin loss. The shift is called disturb.

Inhibit if it is desired to apply erase to a subset of bits, avoiding erase from other bits sharing the same bit lines (BLs), need to apply on the others a positive voltage on the gate, to avoid hole injection. This procedure is called inhibit.

Program time refers to the duration of a single program pulse, or the duration of the whole program sequence algorithm to program a bit set.

Page a part of the array, usually to be either programmed or erased in a specific algorithm sequence. Usually a page is a bit set whose size is pre-defined by the product specifications.

Sector a part of the array, usually larger than page, contains few pages. A minimum erase might include a sector.

programmed "programmed" generally means that the threshold voltage (Vt) of a cell is above a predetermined "program verify" level (Vth).

Page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PAE short for program after erase. PAE is useful to avoid cells that experienced over-erase and significant Vt reduction, to become leaky and cause read errors to all cells sharing the same Bit-lines.

PBE short for program before erase. PBE is useful to bring cells to a more-or-less uniform level prior to performing an erase operation. Particularly, if a cell has been erased a number of times, it may otherwise end up with a negative Vt, which is generally undesirable.

BL short for bit line.

WL short for word line.

SLC short for single level cell. In the context of a floating gate (FG) memory cell, SLC means that one bit of information can be stored in the memory cell. In the context of an NROM memory cell, SLC means that at least two bits of information can be stored in the memory cell.

MLC short for multi-level cell. In the context of a floating gate (FG) memory cell, MLC means that two bits of information can be stored in the memory cell. In the context of an NROM memory cell, MLC means that at least four bits of information can be stored in the memory cell.

HHI short for hot hole injection

CHE short for channel hot electrons

Vt short for threshold voltage

Vs short for source voltage

Vd short for drain voltage

Vg short for gate voltage

Vb short for bulk (or substrate) voltage

BRIEF DESCRIPTION

Summary

It is a general object of the disclosure to provide improved techniques for operating NROM memory cells.

According to an embodiment of the disclosure, a method for operating a plurality of NVM memory cells comprises: performing a first programming step using hot hole injection (HHI) to reduce the threshold voltage (Vt) of selected ones of the memory cells; and performing a second programming step using channel hot electron (CHE) injection to increase the threshold voltage (Vt) of bits of memory cells that were disturbed (unnecessarily programmed) in first programming step. The NVM memory cells may be NROM cells. Each memory cell may have two charge-trapping areas; and each charge-trapping area of a memory cell may capable of storing at least one bit. The HHI programming step may be performed using pulses, separated by reads; and the CHE programming step may be performed with pulses, separated by reads. The plurality of memory cells may comprise a sector; and the sector size may be 128 kilobytes (KB) to 1 megabyte (MB).

According to an embodiment of the disclosure, a method for programming a plurality of memory cells is disclosed, each cell having a characteristic program voltage (PV) and a characteristic erase voltage (EV), the method comprising the steps of: (a) programming first selected ones of the cells by decreasing the threshold voltage of the first selected ones of the cells to less than the program voltage (Vt<PV); and (b) refreshing second selected ones of the cells by increasing the threshold voltage (Vt) of the cells to greater than the erase voltage (Vt>EV). The step (a) may be performed using Hot Hole Injection (HHI); and the step (b) may be performed using Channel Hot Electron (CHE) injection.

According to an embodiment of the disclosure, a method of programming a NVM memory cell comprises: using a combination of hot hole injection (HHI), followed by channel hot electron (CHE). The memory cell may be an NROM memory cell. The memory cell may have two charge-trapping areas; and each charge-trapping area is capable of storing at least one bit. According to a feature of the invention, the method of programming a NVM memory cell may comprise Page Write only with HHI and CHE Programming, without any Erase.

BRIEF DESCRIPTION OF THE DRAWINGS

Reference will be made in detail to embodiments of the disclosure, examples of which may be illustrated in the accompanying drawing figures. The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Figure 1:
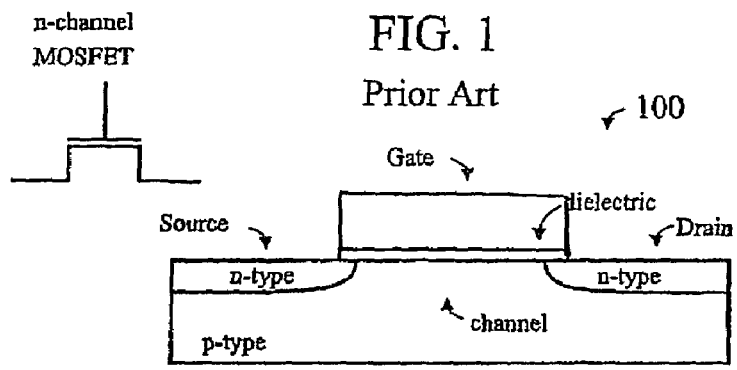
Figure 2:
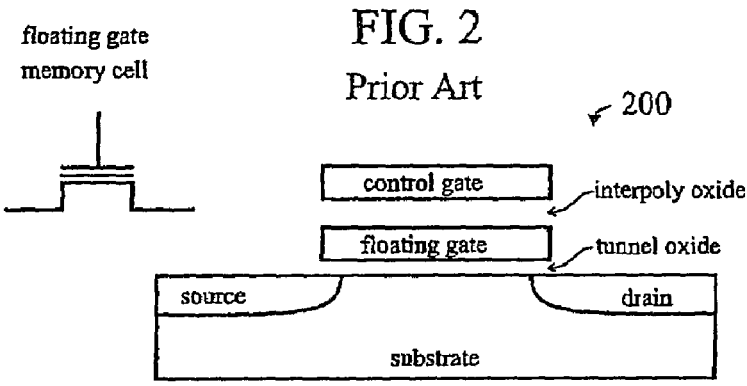

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

FIG. 1 is a stylized cross-sectional view of a field effect transistor (FET), according to the prior art. To the left of the figure is a schematic symbol for the FET.

FIG. 2 is a stylized cross-sectional view of a floating gate memory cell, according to the prior art. To the left of the figure is a schematic symbol for the floating gate memory cell.

Figure 2A:
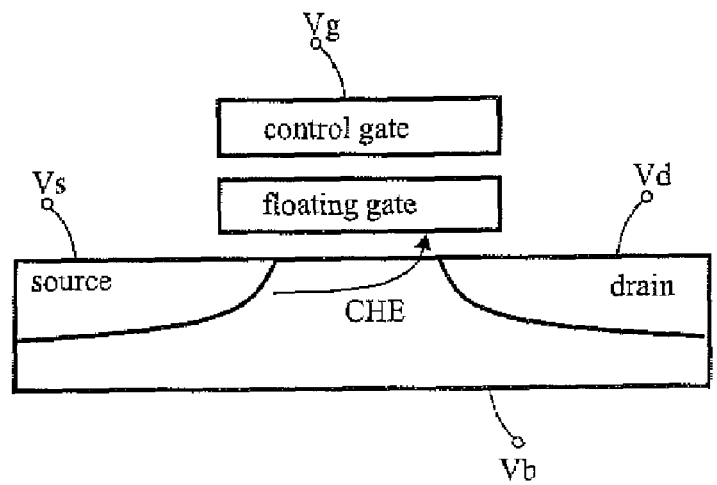
Figure 2B:
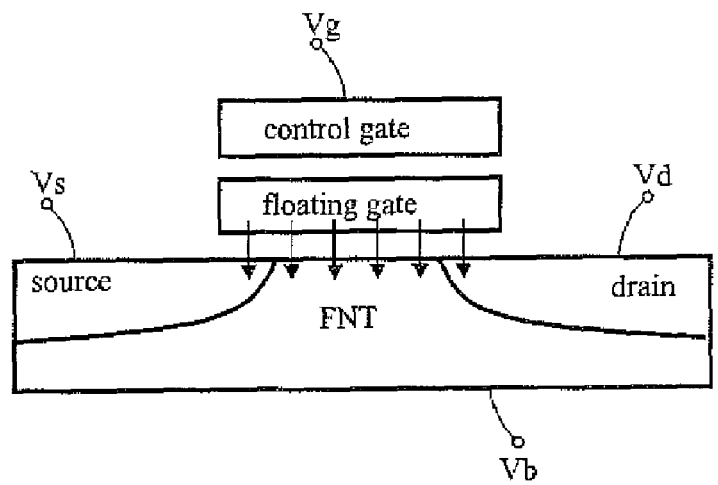

FIGS. 2A and 2B are diagrams illustrating programming and erase mechanisms for a floating gate memory cell, according to the prior art.

Figure 3:
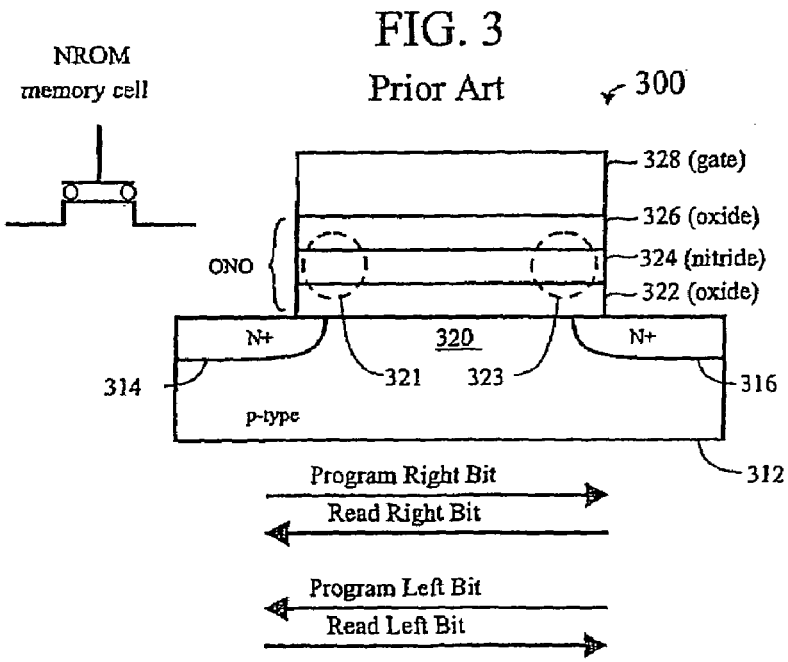

FIG. 3 is a stylized cross-sectional view of a two bit NROM memory cell of the prior art. To the left of the figure is a schematic symbol for the NROM memory cell.

FIGS. 3A-3D are diagrams illustrating programming and erase mechanisms for a NROM memory cell, according to the prior art.

Figure 3A:
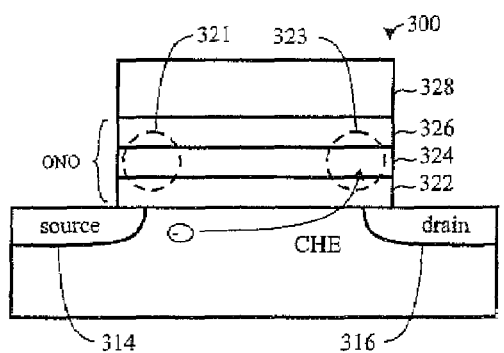
Figure 3B:
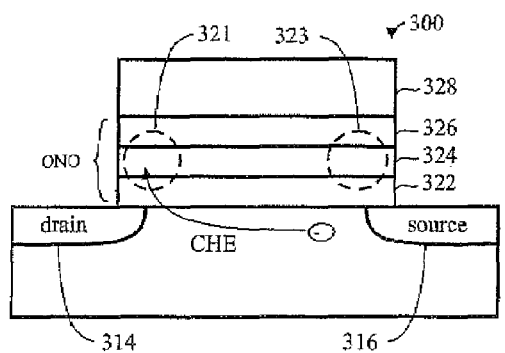
Figure 3C:
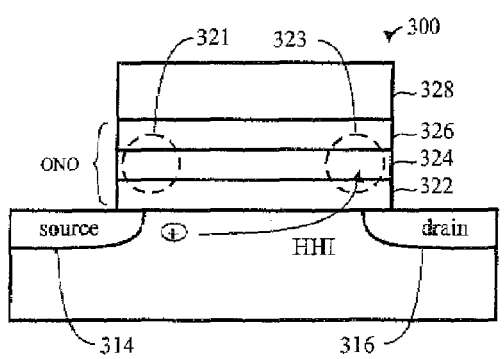
Figure 3D:
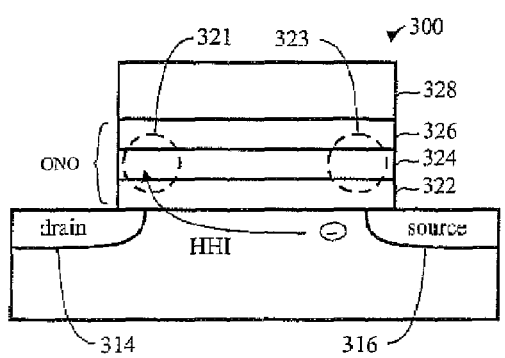
Figure 3E:
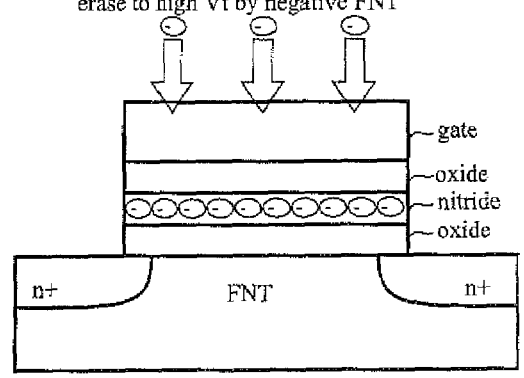
Figure 3F:
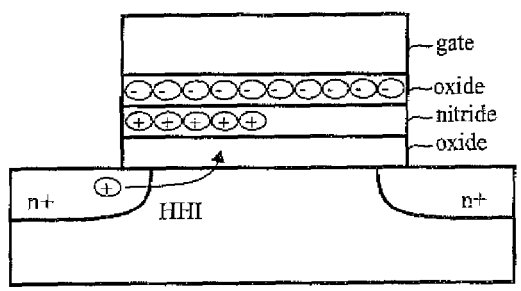
Figure 3G:
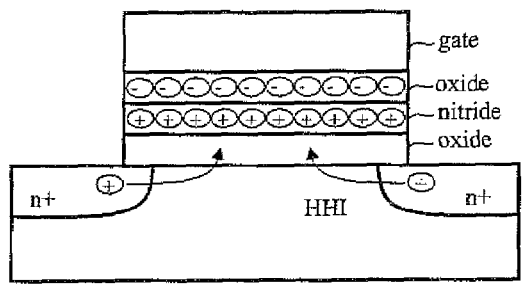

FIGS. 3E-3G are diagrams illustrating programming and erase mechanisms for a NROM memory cell, according to the prior art.

Figure 4:
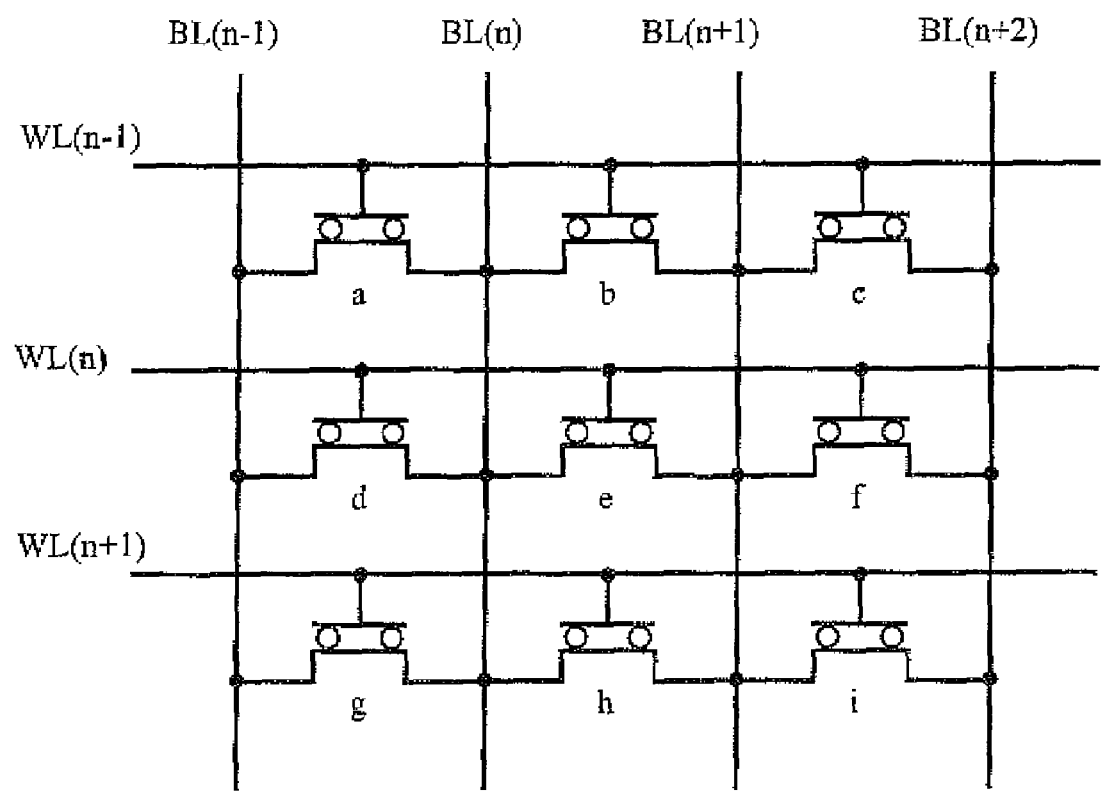

FIG. 4 is a diagram of a memory cell array with NROM memory cells, according to the prior art.

FIGS. 5A-5D are diagrams illustrating a mode of operation, according to this disclosure.

Figure 6A:
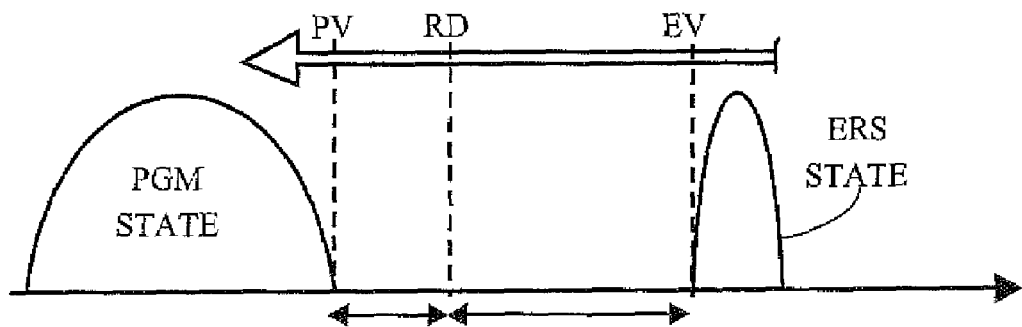
Figure 6B:
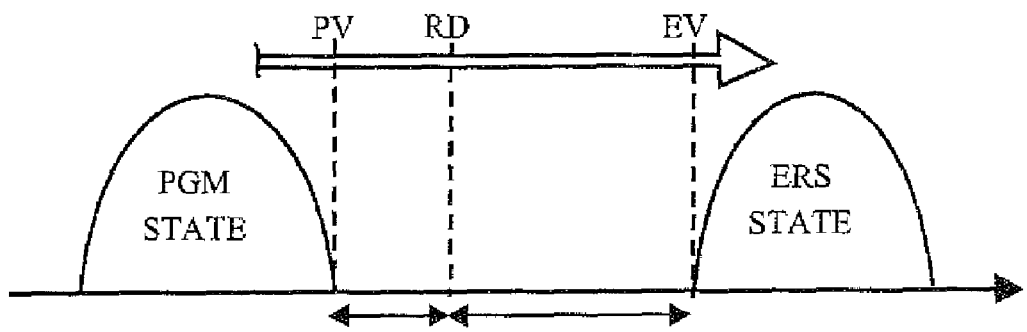

FIGS. 6A-6B are diagrams illustrating another mode of operation, according to this disclosure.

DETAILED DESCRIPTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

As used herein, negative direct current (DC) voltages may be written with a minus sign (−) before a numeral, followed by "v" (for volts), for example −5 v (meaning negative five volts DC), and positive DC voltages may be written either with or without a plus sign (+) preceding the numeral, for example +5 v or 5 v (meaning plus five volts DC).

Introduction

This disclosure is generally related to the operation of an NROM memory cell, including programming, erasing and reading, although the scope of the disclosure is not limited in this respect. Certain other aspects of the memory cell, such as it's structure and fabrication, array architecture and circuits for operating memory cells may also be discussed briefly and generally to put things in context.

Generally, as discussed hereinabove, an NROM cell is an n-channel MOSFET device where the gate dielectric can be thought of as being "replaced" with a trapping material (such as nitride) sandwiched between two silicon dioxide layers (see ONO, FIG. 2A). The NROM cell has two distinct charge-trapping areas, referred to herein as "left" and "right". It also has two diffusion areas which function either as a source and drain, or as a drain and source, depending upon what operation (erase and program, or read) is being performed, on which storage area. An NROM cell is capable of storing at least one bit in each of its two storage areas. For single level cell (SLC) operation, one bit is stored in each of the two storage areas. For multi-level cell (MLC) operation, two or more bits can be stored in each of the two storage areas. Channel Hot Electron (CHE) injection may be used as a programming method, and hot hole injection (HHI) may be used as an erase mechanism. Read operation may be performed in the "reverse" mode where the role of the source and drain are interchanged relative to the programming operation. Exemplary existing conditions for operating an NROM memory cell are shown in the following table.

TABLE 4

Existing NROM Conditions

| | Vs | Vg | Vd | Vb | time/pulses |
|---|---|---|---|---|---|
| NEG Erase (TEHH) | float, or 2 v | ∼−7 v | 3-5 v | 0, gnd | 150 μsec |
| POS Erase (HHI) | float | 0 v | 6-8 v | 0, gnd | 1-100 msec |
| Program (CHE) | gnd (0 v) | 8-10 v | 4-6 v | 0, gnd | 100-1000 nsec |
| Read | gnd (0 v) | 3-5 V | 1-2 v | 0, gnd | 10-100 nsec | wherein:
Vs is the source voltage (left terminal relative to program or erase of a right bit)
Vg is the gate voltage (in an array, the word line to which the cell is connected)
Vd is the drain voltage (right terminal relative to program or erase of a right bit)
Vb is the bulk (or substrate) voltage
v abbreviation for volt
gnd abbreviation for ground, which is defined as 0 volts
float means disconnected
nsec or "ns", is nanosecond (one billionth of a second)
μsec or "μs", is microsecond (one millionth of a second, or 1000 nanoseconds)
msec or "ms", is millisecond (one thousandth of a second, or 1000 microseconds)

The erase and program operations may typically be performed using a few cycles of pulses followed by verify (read).

Negative (NEG) erase and positive (POS) erase operations both involve a hot hole injection (HHI) mechanism, but they are performed differently than one another. Generally, NEG erase is faster, but requires special transistors. Generally, POS erase can be performed with better circuits, but is slower.

New NROM Modes of Operation

A problem being addressed by this disclosure is achieving programming at a rate of 20 MB/second in 2-bit (SLC) operation, and corresponding 10 MB/second in 4-bit (MLC) operation, although the scope of the disclosure is not limited in this respect.

The disclosure that follows is presented in two distinct, but related parts:

Part 1. FN Erase to High Vt & HHI+CHE Programming

Part 2. Page Write only with HHI and CHE Programming, No Erase

Generally, the injection mechanisms of Fowler-Nordheim tunneling (FNT), Hot Hole Injection (HHI) and Channel Hot Electron (CHE) injection, which have been described hereinabove, are used to modify (program and erase) the threshold voltage (Vt) of storage areas of memory cells. As will become evident, it is important to note that using these injection mechanisms, and with the memory cells arranged in an array (including virtual ground array architecture), it is important to note that:

FNT is a 2-terminal operation (Gate & Substrate or Gate and S/D);

HHI is a 3-terminal operation (Gate, Drain & Substrate); and

CHE is a 4-terminal operation Gate, Source, Drain & Substrate).

In some cases, the substrate terminal is considered as an obvious ground and is not counted as a separate terminal, in which case:

FNT is a 1-terminal operation (Gate);

HHI is a 2-terminal operation (Gate & Drain); and

CHE is a 3-terminal operation Gate, Source& Drain).

It is important to note, for example, that an operation performed on a given memory cell (such as the cell "d" in FIG. 4)

can have an undesired effect on a neighboring memory cell (such as the cell "e" in FIG. 4), because the right hand diffusion of cell "d" is connected to the same bit line (BL(n)) as the left hand diffusion of cell "e". (Moreover, in virtual ground array architecture, a single diffusion may be shared by the neighboring cells, serving as the drain for one cell and the source for the neighboring cell.) And, cells "d" and "e" both have their gates connected to a common word line (WL(n)). Therefore, as a general proposition, with an array architecture (of word lines and bit lines), the only injection mechanism that can selectively modify only a given bit of a given cell, without having an undesired effect on the other bit of the cell or on a bit of a neighboring cell, is a 3-terminal operation, which, for purposes of this discussion, is CHE injection.

Part 1. FN Erase to High Vt & HHI+CHE Programming

This technique may be referred to herein simply as "FNT & HHI+CHE". Generally, the technique disclosed herein reduces the erase time, and doubles the programming time, which can result in a net savings of time, although the scope of the disclosure is not limited in this respect.

As a general proposition, the operation of writing requires an erase step (setting the cell(s) to a predetermined state), followed by a programming step (writing data into the cell(s)).

For purposes of this disclosure, the term "write" is equivalent to its grammatical variant "writing", the term "erase" is equivalent to its grammatical variant "erasing", the term "program" is equivalent to its grammatical variant "programming", and the term "read" is equivalent to its grammatical variant "reading".

Generally, the write speed equals the erase speed plus the program speed. Therefore, if it were to be assumed (for illustrative purposes) that the erase speed and the program speed were equal, then by bringing the erase speed to zero, one could automatically double the write speed. Therefore, generally, an overall goal in this method of operation involving FNT & HHI+CHE is generally to reduce the erase speed, thereby achieving a reduction in write speed.

Generally, this FNT & HHI+CHE mode of operation involves three operations (steps), performed in the following sequence:

Fowler-Nordheim Tunneling (FNT) erase step

Hot Hole Injection (HHI), first programming step

Channel Hot Electron (CHE) injection, second programming (or recovery) step

Generally, each of the injection mechanisms used herein (FNT, HHI, CHE) are well known, and they may be performed in a conventional manner using a number (typically, only a few) of pulses followed by verify to ensure that a desired Vt is achieved.

FIGS. 5A-5D are diagrams illustrating the principles of operation of this FNT & HHI+CHE mode of operation, although the scope of the disclosure is not limited in this respect.

The horizontal axis in the diagrams represents threshold voltage (Vt), left is low, right is high. In the diagrams, three levels of threshold voltage (Vt) are illustrated:

PV—program verify (for example, Vt=Vt initial+ 0.5V~2.5-3V)

RD—read verify level (higher than PV, for example, Vt=Vt initial+1V~3-3.5V)

EV—erase verify level (higher than RD, for example, Vt=Vt initial+2V~4-4.5V)

The abbreviation ERS stands for "erase". The abbreviation PGM stands for "program".

Typically, the difference (delta Vt) between EV and PV may be 1.5 volts (EV=PV+1.5), and RD may equal PV plus 0.5 volts (RD=PV+0.5), or EV minus 1.0 volts (RD=EV−1.0), although the scope of the disclosure is not limited in this respect.

FNT—Erase

First, an erase step is performed using FNT to establish a high initial Vt, such as 4-5 volts, by applying the following exemplary voltages to the memory cell (and substrate):

The source (or left terminal for programming the right bit) voltage Vs is set to 0 volts (0 v);

The gate voltage Vg is set high, such as 10-14 volts, such as for 1 millisecond (1 msec);

The drain (or right terminal for programming the right bit) voltage Vd is set to 0 volts (0 v); and The substrate voltage Vb is maintained at 0 volts (0 v).

These conditions are sufficient to cause the desired F-N tunneling to simultaneously (in one step) erase both left and right storage areas in the NROM memory cell, although the scope of the disclosure is not limited in this respect.

Regarding the gate voltage (Vg), as set forth above, in the FNT erase step the gate voltage (Vg) is set high, such as 10-14 volts, such as for 1 millisecond (1 msec). It would generally be desirable to operate under all circumstances with less than 10 v, but to do that would require thinning down the ONO so much that other operations would be difficult to handle. Often, certain tradeoffs need to be made to achieve sometimes competing objectives. In this example, using a thicker ONO, to make 1 msec feasible, more than 10 volts is needed.

The FNT erase step is performed on a plurality of memory cells, such as an entire block, and may be implemented using pulses of 250 μsec each, followed by verify. (A 1 msec erase time would be achieved with four pulses.) Only a few bits need to be verified, because any bit that does not reach the correct level in this FNT erase step can later be corrected (in the CHE refresh step), as described in greater detail hereinbelow.

The FNT to high Vt operation is a single-terminal operation, involving applying a high voltage to the many WLs in parallel and each WL has a plurality of memory cells. As an example 128 Kbit to 1 Mbit of cells can be erased in the same erase pulse. Since, in a typical array architecture, the gates of several memory cells are connected to the same word line (WL), this means that you can only insert the same information into all bits that are being subjected to this mechanism (which is why it is an erase mechanism, not a program operation), which is all of the memory cells on the word lines being subjected to FNT gate voltages (Vg).

Generally speaking, inserting electrons into the charge-storage area of a memory cell increases threshold voltage (Vt) of the memory cell, and removing electrons from (or inserting holes into) the charge-storage area of the memory cell decreases the characteristic threshold voltage (Vt) of the memory cell. Generally, for purposes of this disclosure, the state of high threshold voltage is defined as binary "1", and the state of low threshold voltage is defined as binary "0", although the scope of the disclosure is not limited in this respect. In other publications and references, low Vt is defined as a logic "1", and high Vt is defined as logic "0"—the opposite of how they are defined here, but these definitions are arbitrary, and the scope of the disclosure is not limited in this respect.

Figure 5A:
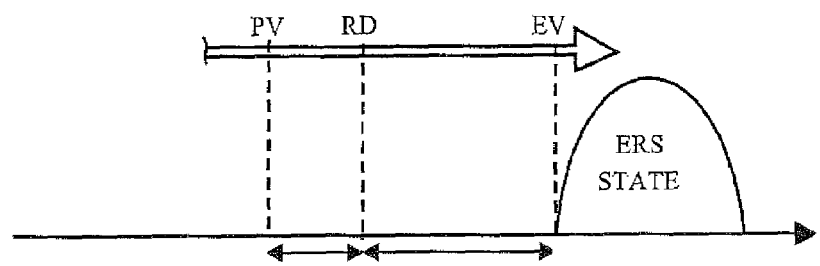

FIG. 5A illustrates graphically the FNT erase to high Vt operation. In this step, all of the cells (including both bits of each NROM cell), in a plurality of cells (such as a page, a sector, or an entire array), are raised to a high Vt above Vt=EV.

Since this is a 1-terminal operation (high voltage applied to the word line/gates of the memory cells), this step should be very homogeneous, and all of the cells being erased are readily brought to a high Vt erase (ERS) state, from whatever state they may previously have been in. Only a small amount of pulses (for example, fewer than 5 pulses) need be applied to bring nearly (almost) all of the cells to the desired high Vt erase state. Those cells which are not fully erased in this step will be corrected in the subsequent CHE Refresh step, described hereinbelow (and illustrated in FIG. 5D).

A verify operation can be performed on a very small population, since all that is needed is a flag to show that a sector is erased, then the content itself is irrelevant. A great time savings can thus be realized. A typical erase sector size is 128 kilobytes (KB) to 1 megabyte (MB), although the scope of the disclosure is not limited in this respect.

For purposes of this description, a "page" may comprise one word line such as 512 bytes (4096 memory cells), and a "sector" may comprise many pages), although the scope of the disclosure is not limited in this respect.

For purposes of this description, the erase (ERS) state is high Vt, and is deemed to be logic "1"), although the scope of the disclosure is not limited in this respect.

HHI—First Programming Step

Next, a first programming step is performed using BBHHI (band-to-band hot hole injection) page data insertion. (BBHHI is simply a different nomenclature for HHI. For purposes of this discussion, the first programming step is hot hole injection.)

This HHI first programming step may be implemented using the following exemplary voltages.

The source (or left terminal for programming the right bit) voltage Vs is "shunt" or "floating".

The gate voltage Vg is set to −5 to −8 volts, such as −7 volts.

The drain (or right terminal for programming the right bit) voltage Vd is set to 4-7 volts, such as 5 volts.

The substrate voltage Vb is suitably maintained at 0 volts (0 v)

Note that the source (or left terminal for programming the right bit) voltage Vs is "shunt" or "floating". This is typical for a HHI operation. The initial level for the source voltage (Vs) may be close to 0 v. As the operation advances, Vs may be increased until an equilibrium reached, typically at a few volts. When the source voltage (Vs) is increasing (from 0 to a few volt), a disturb (in a neighboring cell on the same BL, different WL where inhibit voltage of ~+2-3V is applied) may be induced. In order to avoid this, a shunt resistor may be used to force the source voltage (Vs) to be brought to a predetermined state, very fast and avoid the disturb. The bits on the same WL may also suffer from disturb, but this happens only for the short time of the HHI operation on that specific WL. In the case of the neighbor cells with the inhibit WL voltage, their disturb can happen over many write cycles, since any erase sector has typically 16-64 WLs and 8-16 erase sectors typically share the same BL. As an example, for a physical sector with 8 erase sectors the neighbor inhibit may happen 7*10K cycles or 70K times.

These conditions are sufficient to cause the desired programming of a selected storage area in the NROM memory cell, and may be repeated (with source and drain reversed) to program the other storage area in the NROM memory cell, although the scope of the disclosure is not limited in this respect.

Using HHI, hot holes are injected into the desired storage area, which lowers Vt (program to logic "0"). However, since this is a 2-terminal operation, there may be an undesired effect on a neighboring memory cell, as discussed in greater detail hereinbelow.

Because the HHI programming is not perfect (the states of neighboring cells may be affected), it can be through of as a "partial programming", or as a first of two (or more) programming steps, as described hereinbelow.

These programming voltages for HHI are applied as pulses, typically of 10 microseconds (10 μsec to 50 usec) each, and a few pulses (comprising cycles of program then verify) may be required to obtain the desired decrease in Vt. Each pulse is followed by a verify (read) to determine whether the desired reduction in Vt has been achieved. Generally, no more than 5 pulses will be required. It is important to understand that only half of the BLs can be programmed simultaneously in the same page. No two neighboring BLs (such as BL(n) & BL(n+1)) can have the BL voltage in the same time. This is typically not a problem, because a typical page may have 1-16K BLs associated with it, and the data insertion is in smaller groups like 128 to 512 bit's in the same time. This provides a distance of more than 2 BLs away from each other during a HHI BL pulse.

Figure 5B:
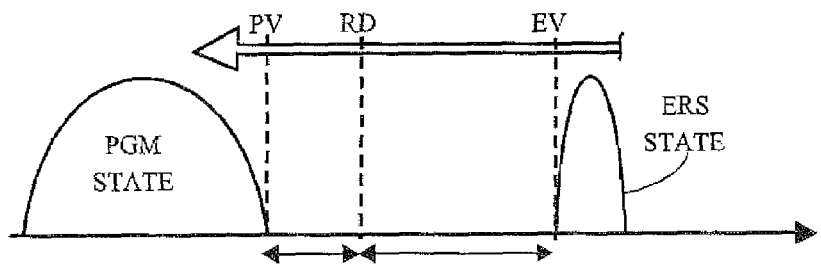

FIG. 5B illustrates graphically the HHI programming (or first programming) step. In this first programming step, selected bits are desired to be taken from the high Vt erase (ERS) state to a low Vt program (PGM) state—their Vt is lowered to below Vt=PV. The HHI programming step may be performed using pulses, as described hereinabove.

Since this is a 2-terminal operation (gate plus drain), the programming of a bit of one cell can affect (alter, change, modify) the state of a bit in a neighboring cell.

Referring back to FIG. 4, it can be observed (for example) that the right hand diffusion of cell "d" is connected to the same bit line (BL(n)) as the left hand diffusion of cell "e". (In virtual ground architecture, there is one diffusion that is shared by the neighboring cells.) And, cells "d" and "e" both have their gates connected to a common word line (WL(n)). Thus, with a 2-terminal operation, neighboring bits may be disturbed or, more descriptively, unnecessarily (and unavoidable) programmed.

Whereas the term "disturb" may include slight changes in Vt, what we are talking about here is clearly and suddenly changing the state of (programming) a bit that is not desired to be changed. This is simply an inherent result of the 2-terminal operation in conjunction with the array architecture. Thus, using HHI by itself would not be suitable for programming, which is why there is a further step of CHE refresh, described hereinbelow.

For example (Case #1), to start with (after FNT erase, before HHI program), all bits are erased. For example (referring to FIG. 4), the right bit of cell "d" is erased (binary "1") and the left bit of cell "e" is erased (binary 1).

If both of these bits are supposed to remain binary "1", there is no need for programming either one of them.

If, on the other hand, it is desired to program the right bit of cell "d" to binary "0", and leave the left bit of cell "e" at binary "1", this cannot be done with the 2-terminal HHI program step. By programming one of the bits to binary "0", the other one of the bits sharing the same bit line (BL(n)) will be programmed to "0", and will need to be "refreshed" to binary "1", as described hereinbelow.

This effect of one bit on another, sharing the same bit line can be called a "disturb". In the traditional sense, "disturb" is when the Vt of a cell (or a bit of a cell) is affected, however slightly, as a result of an operation being performed on another neighboring or nearby cell (or another bit of the same cell). Sometimes, disturbs can be small, and may not have an effect until many operating cycles. What is happening here, although it may be referred to as "disturb" is more of an undesired (unnecessary) programming of a bit than a disturb, and may be conceptualized as a large disturb. One operating cycle and "the damage is done", and needs to be corrected (desired logic state of the disturbed bit refreshed), as described hereinbelow.

CHE—Second Programming Step

Next, a second programming step (which may also referred to as "refresh" or "recovery") is performed using CHE to recover (refresh) data of low Vt bits (disturbed/unavoidably programmed in the previous step) that need to be high Vt.

This CHE second programming step may be implemented using the following exemplary voltages.

The source (or left terminal for programming the right bit) voltage Vs is set to ground.

The gate voltage Vg is set to 5-8 volts, such as 7 volts.

The drain (or right terminal for programming the right bit) voltage Vd is set to 4-5 volts, such as 4.5 volts.

The substrate voltage Vb is suitably maintained at 0 volts (0 v).

In this step, the source is grounded, rather than shunted, because it is needed as a source of electrons for CHE, although the scope of the disclosure is not limited in this respect.

These conditions are sufficient to cause channel hot electrons (CHE) to be injected into the storage area, which increases the Vt of the storage area (for example, of the storage area 323 over the right diffusion acting as drain, see FIG. 3). This (CHE) is what is called a "three terminal" operation (source, gate, and drain), and control over individual bits can be maintained without disturbing (unavoidably changing the state of) adjacent/neighboring bits.

These CHE recovery operation voltages are applied as pulses, typically of 150 nanoseconds (150 ns) each, and a few pulses (comprising cycles of program then verify) may be required to obtain the desired increase in Vt. Generally, no more than 5 pulses will be required. It can be observed that this second (CHE) programming step proceeds much faster, such as approximately 50-100 faster than the previous first (HHI) programming step. (150 nanoseconds is one tenth of 1.5 microseconds, and one-hundredth of 15 microseconds.)

Figure 5C:
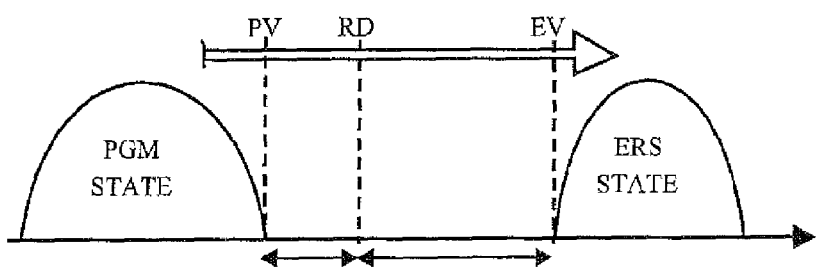

FIG. 5C illustrates a first part of the CHE refresh step ($2^{nd}$ programming step). This is a 3-terminal operation. In this step, bits are refreshed (this can be thought of as re-programming) which were programmed unnecessarily, such as by being connected to the same bit line as a neighboring bit which was desired to be programmed, as described hereinabove.

Pulses, followed by verify are used to bring bits which were unavoidably programmed in the previous HHI step back to their desired (pre-programmed) high Vt state (binary "1"). A bit which was unnecessarily programmed (to binary "0"), needs to be erased (back to binary "1"). This is called "refresh".

Using the previous example (cells "d" and "e", FIG. 4), it was desired to program the right bit of cell "d" to binary "0", and leave the left bit of cell "e" at binary "1", but the left bit of cell "e" became programmed to binary "0" because it shares a bit line (BL(n)) with cell "d". Therefore, the left bit of cell "e" needs to be refreshed to the desired binary "1" erase (ERS) state. And, this is done with CHE injection, a 3-terminal operation, which can program the left bit of cell "e" without changing the state of the right bit of cell "d". Again, accounting for which bits need to be refreshed is well within the purview of one of ordinary skill in the art, and does not require any further explanation herein.

Recall, from above, that in the FNT erase operation, only a few bits were verified. Then the process was stopped. It is possible (expected, statistically likely) that some of the bits did not quite make it to Vt>EV. This would generally not be acceptable, without the following.

Figure 5D:
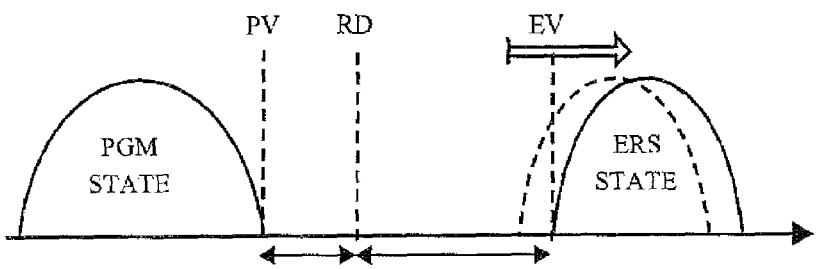

FIG. 5D illustrates a second part (continuation) of the CHE refresh step ($2^{nd}$ programming step). Here, bits which did not quite make it up over the EV level (to Vt>EV) in the previous part of the CHE refresh step (FIG. 5C) are pulsed again to bring them to the correct erase (ERS) state (logic "1")—Vt is pushed up over the EV level. The "a second part of the CHE refresh" is actually done together with the $1^{st}$ part. All bits that need the CHE are identified and being programmed in parallel.

This illustrates a major advantage of the method disclosed herein. Since it is only necessary to verify a few bits in the FNT erase step, a lot of time can be saved. Bits which were not fully erased in the FNT erase step can easily be corrected (to binary "1") in the CHE Refresh step. For example, a typical number of erased bits that needs CHE due to HHI are <25% and never exceeds 50%. The number of erased bits that needs refresh due to their Vt<PV is less than 1%.

Exemplary conditions for the FNT, HHI and CHE operations (steps) described hereinabove, in the FNT & HHI+CHE NROM mode of operation disclosed herein are:

TABLE 5

NROM Operating Conditions

| | Vs | Vg | Vd | Vb | time |
|---|---|---|---|---|---|
| Erase (FN) | 0 v | 10-14 v | 0 v | 0 v | 1 msec |
| Program (HHI) | floating | −7 v | 5 v | 0 v | 10-50 μsec |
| Recovery (CHE) | ground | 7 v | 4.5 v | 0 v | 150 ns/pulse | wherein:
Vs is the source voltage (left terminal relative to program or erase a right bit)
Vd is the drain voltage (right terminal relative to program or erase a right bit)
Vg is the gate voltage (in an array, the word line to which the cell is connected)
Vb is the bulk (or substrate) voltage
sec or "s" is seconds
msec is milliseconds (thousandths of a second, or 0.001 sec)
μsec is microseconds (millionths of a second, or 0.000001 sec)
ns is nanoseconds (billionths of a second, or 0.000000001 sec)

The erase and program operations may typically be performed using a few cycles of pulses followed by verify (read).

Advantages of the FNT & HHI+CHE mode of operation disclosed herein may include,
  very low power erase operation;
  very high erase speed (on the order of 1 msec for 1 Mbit or 128 MB/sec erase speed);
  no PAE (program after erase) or PBE (program before erase) are required;
  better scaling due to channel electrons that reduce the punchthrough problem; and
  better retention, although the scope of the disclosure is not limited in this respect.

Because FNT to high Vt is chosen as the erase mechanism, over-erase is generally not a problem, and because FNT is a 1-terminal operation on the WL (gate), there is generally no concern of BL to BL leakage due to the erase operation.

Generally, PAE or PBE can be avoided because the first step (erase) is to a high Vt, rather than to a low Vt. By avoiding performing PAE or PBE to ensure reliability, a significant time savings can be realized, although the scope of the disclosure is not limited in this respect. (In a sense, the CHE step substitutes for, or eliminates the need for, PAE.)

Better scaling is generally in contrast to a typical CHE program mode of operation because this FNT & HHI+CHE mode of operation does not use CHE injection in the first two steps, thereby statistically significantly reducing the need for CHE, which is a very high power operation. Thus, for a given power limitation (budget), more cells can be programmed than otherwise, if one were to rely solely on CHE for programming.

Better scaling is also a result primarily of performing erase to a high Vt, rather than to a low Vt, although the scope of the disclosure is not limited in this respect.

Disadvantages of the FNT & HHI+CHE mode of operation disclosed herein may include, it generally requires having very thin ONO (such as 1 nm per volt), and is subject to programming disturb problems (FNT generally requires thin lower oxide to function successfully—approximately 1 volt per nanometer (nm)), although the scope of the disclosure is not limited in this respect.

Regarding the dependency on thin ONO, typical ONO dimensions thicknesses are:

approximately 4 nm for the lower oxide (322, FIG. 3)
approximately 4 nm for the nitride (324, FIG. 3)
approximately 10 nm for the upper oxide (326, FIG. 3)

For performing the FNT & HHI+CHE mode of operation disclosed herein, the ONO layer may have the following thicknesses:

approximately 2.7-3.3 nm for the lower oxide (322, FIG. 3)
approximately 2-4 nm for the nitride (324, FIG. 3)
approximately 7-9 nm for the upper oxide (326, FIG. 3)

Part 2. Page Write HHI+CHE Programming, No Erase

This technique (NROM mode of operation) may be referred to herein simply as "HHI+CHE, No Erase", and shares many components with the above-described "FNT & HHI+CHE" mode of operation, the teachings of which are expressly incorporated in their entirety by reference herein.

FIGS. 6A-6B are diagrams illustrating the principles of operation of this HHI+CHE Programming, No Erase mode of operation, although the scope of the disclosure is not limited in this respect.

The horizontal axis in the diagrams represents threshold voltage (Vt), left is low, right is high. In the diagrams, three levels of threshold voltage (Vt) are illustrated:

PV—program verify (for example, Vt=Vt initial+0.5V~2.5-3V)
RD—read verify level (higher than PV, for example, Vt=Vt initial+1V~3-3.5V)
EV—erase verify level (higher than RD, for example, Vt=Vt initial+2V~4-4.5V)

The abbreviation ERS stands for "erase". The abbreviation PGM stands for "program".

Typically, the difference (delta Vt) between EV and PV may be 1.5 volts (EV=PV+1.5), and RD may equal PV plus 0.5 volts (RD=PV+0.5), or EV minus 1.0 volts (RD=EV−1.0), although the scope of the disclosure is not limited in this respect.

Generally, in contrast with the above-described FNT & HHI+CHE mode of operation this HHI+CHE Programming, No Erase mode of operation further reduces the erase time, to zero, although the scope of the disclosure is not limited in this respect.

Generally, in a manner similar to the above-described FNT & HHI+CHE mode of operation this HHI+CHE, No Erase mode of operation essentially doubles the programming time, which can result in a net savings of time, although the scope of the disclosure is not limited in this respect.

In contrast with the above-described FNT & HHI+CHE mode of operation, in this HHI+CHE, No Erase mode of operation, the erase step using FN electron tunneling to establish a high initial Vt is omitted. Therefore, in essence, the erase time is zero.

In this HHI+CHE, No Erase mode of operation, data alteration (programming) is accomplished using HHI/CHE ($1^{st}$ programming—CHE).

PAE is essentially part of CHE programming, and PBE is not required.

Exemplary conditions for the HHI+CHE, No Erase NROM mode of operation are:

TABLE 6

| NROM Operating Conditions | | | | | |
|---|---|---|---|---|---|
| | Vs | Vg | Vd | Vb | time |
| CHE | 0 v | 9.5 v | 4.5 v | 0 v | 1 μsec |
| HHI | 2 v | −8 v | 4 v | 0 v | 10 μsec |

The erase and program operations may typically be performed using a few cycles of pulses followed by verify (read).

Advantages of the mode of operation disclosed in this section may include, there is no erase step required;
there is no dedicated PAE/PBE (PAE is effectively performed by the CHE);
there is no over-erase due to bit-by-bit erase;
utilizing bit-by-bit erase & fewer program/erase cycles may result in better retention;
this mode of operation supports 4-bit (MLC) operation; and
the ONO can stay thicker relative to the FNT & HHI+CHE, since no need for the high voltage FNT step, although the scope of the disclosure is not limited in this respect.

To start with, before performing the HHI+CHE, No Erase mode of operation, some bits will be in an erase (ERS) state (binary "1", Vt>EV), and other bits will be in the program (PGM) state (binary "0", Vt<PV).

Generally, the goal is to take some (selected ones) of the bits from the erase (ERS) state (binary "1") to the program (PGM) state (binary "0"), and leave other bits in the erase (ERS) state (binary "1"). This is "programming".

In a first step, HHI is used to take the necessary bits from the erase (ERS) state (binary "1") to the program (PGM) state (binary "0").

FIG. 6A (compare FIG. 5B) illustrates this HHI programming step. In this first programming step, selected bits are taken from the erase (ERS) state to the program (PGM) state—their Vt is lowered to below PV. As described hereinabove, this may be done with a few pulses followed by verify.

In this first program step (HHI), all bits that are being programmed must be verified. (Similar situation with FIG. 5B HHI programming step).

In FIG. 6A it can be noticed that the curve representing cells (bits) in the ERS state is smaller and narrower than the curve representing cells (bits) in the ERS state after FNT erase which was shown in FIG. 5A. This is intended to be qualitative, rather than quantitative, intended only to represent that in FIG. 6A, only some of the bits will originally be in the erase state, whereas in FIG. 5A all of the bits were forced to the erase state, although the scope of the disclosure is not limited in this respect. Otherwise, the HHI programming step illustrated in FIG. 6A is similar to the HHI programming step illustrated in FIG. 5B.

Before performing this step, some bits will be in the PGM state (low Vt, logic "0"), and other bits will be in the ERS state (high Vt, logic "1"). Before writing (programming) a bit, it is first read to determine whether it is in the desired logic state, or not.

a. If the bit is at logic "1", and it is desired to keep it at logic "1", nothing needs to be done (but its state may be altered as a result of programming a neighboring bit to logic "0", in which case it will need to be "refreshed" using CHE after the HHI program operation).

b. If the bit is at logic "0", and it is desired to keep it at logic "0", nothing needs to be done.

c. If the bit is at logic "1", and it is desired to make it "0", it is programmed by HHI.

d. If the bit is at logic "0", and it is desired to make it "1", nothing needs to be done (but its state may be altered as a result of programming a neighboring bit to logic "0", in which case it will need to be "refreshed" using CHE after the HHI program operation).

As described hereinabove with regard to the FNT & HHI+CHE mode of operation, programming one bit (to binary "0") can have an undesired, unnecessary effect of programming another bit sharing the same bit line (to binary "0"), and the correct state of the other bit will need to be refreshed (restored).

For example, if is desired to bring the right bit of the left cell ("d") to 0, the left bit of the right cell ("e") will also be brought to logic "0".

Therefore, as shown in FIG. 6B, in a next step, a CHE "refresh" step (or "second programming step") is performed (which is a 3-terminal operation), and the left bit of the right cell ("e"), which was unnecessarily programmed, can be refreshed back to its desired erase (ERS) state (logic "1"). This CHE step of correcting bits which were unnecessarily programmed during the HHI programming step is comparable to the step illustrated in FIG. 5C.

Exemplary voltages for performing the HHI erase step are:

the left terminal (source) is set to 1-3 volts, such as 2 volts (the shunt concept works here the same way it is done in the FNT & HHI+CHE embodiment);

the gate is set to −7 to −9 volts, such as −8 volts;

the right terminal (drain) is set to 3-5 volts, such as 4 volts; and the substrate is set to 0 volts.

Reasons why the HHI voltages in the programming step of this HHI+CHE, No Erase mode of operation may be different than the HHI voltages in the programming step of the previously described FNT & HHI+CHE mode of operation due to the smallest number of bits that needs the HHI. This permits a typically faster erase time in this case, hence, the voltages may be slightly different.

Exemplary voltages for performing the CHE refresh step in the second programming step:

the left terminal (source) is set to ground (0 v);

the gate is set to 9-10 volts, such as 9.5 volts;

the right terminal (drain) is set to 4-5 volts, such as 4.5 volts; and the substrate is set to 0 volts.

For performing the HHI+CHE, No Erase mode of operation disclosed herein, the ONO layer may have the following thicknesses (in this case the ONO may be the same as the typical ONO of a standard NROM product):

approximately 3-4 nm for the lower oxide (222, FIG. 2);

approximately 2-5 nm for the nitride (224, FIG. 2); and approximately 8-12 nm for the upper oxide (226, FIG. 2).

An advantage of this mode of operation is that the logic can deal with a page at a time since there is no big block erase operation. This simplifies the logic and may result in a smaller die.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. A method for programming a plurality of memory cells, each cell having a program verify voltage (PV) and an erase verify voltage (EV), the method comprising:

programming first selected ones of the cells by decreasing the threshold voltage of the first selected ones of the cells to less than the program verify voltage (Vt<PV); and refreshing second selected ones of the cells by increasing the threshold voltage (Vt) of the second selected ones the cells to greater than the erase verify voltage (Vt>EV).

2. The method of claim 1, wherein:

programming of said first selected ones of the cells is performed using Hot Hole Injection (HHI); and the refreshing is performed using Channel Hot Electron (CHE) injection.

3. A device comprising:

a plurality of memory cells, each cell having a program verify voltage (PV) and an erase verify voltage (EV); and a controller coupled to the plurality of memory cells for programming first selected ones of said cells by decreasing the threshold verify voltage of the first selected ones of the cells to less than the program verify voltage (Vt<PV), and refreshing second selected ones of the cells by increasing the threshold voltage (Vt) of the second selected ones of the cells to greater than the erase verify voltage (Vt>EV).

4. The device of claim 3, wherein programming of said first selected ones of the cells is performed using Hot Hole Injection (HHI), and the refreshing is performed using Channel Hot Electron (CHE) injection.

5. A circuit for operating a nonvolatile memory array comprising:

one or more charge pumps functionally associated with a plurality of memory cells, each cell having a program verify voltage (PV) and an erase verify voltage (EV); and a controller coupled to the plurality of memory cells for programming first selected ones of said cells by decreasing the threshold voltage of the first selected ones of the cells to less than the program verify voltage (Vt<PV), and refreshing second selected ones of the cells by increasing the threshold voltage (Vt) of the second selected ones of the cells to greater than the erase verify voltage (Vt>EV).

6. The circuit of claim 5, wherein programming of said first selected ones of the cells is performed using Hot Hole Injection (HHI), and the refreshing is performed using Channel Hot Electron (CHE) injection.

* * * * *